United States Patent
Shiozawa

(10) Patent No.: US 8,816,709 B2
(45) Date of Patent: Aug. 26, 2014

(54) ELECTRONIC COMPONENT TESTING DEVICE AND ELECTRONIC COMPONENT TRANSPORT METHOD

(75) Inventor: Masakuni Shiozawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 774 days.

(21) Appl. No.: 13/107,025

(22) Filed: May 13, 2011

(65) Prior Publication Data

US 2011/0279136 A1    Nov. 17, 2011

(30) Foreign Application Priority Data

May 14, 2010    (JP) ................................. 2010-111825

(51) Int. Cl.
*G01R 31/308*    (2006.01)
(52) U.S. Cl.
USPC ............. 324/750.23; 324/750.22; 324/750.13
(58) Field of Classification Search
CPC . G01R 31/2891; G01R 1/0483; G01R 1/0491
USPC .................................................. 324/750.23
See application file for complete search history.

(56) References Cited

U.S. PATENT DOCUMENTS

| | | | |
|---|---|---|---|
| 7,298,156 B2 | 11/2007 | Okuda et al. | |
| 7,471,819 B2 * | 12/2008 | Ichikawa et al. | 382/145 |
| 7,598,756 B2 | 10/2009 | Inoue et al. | |
| 7,696,767 B2 | 4/2010 | Inoue et al. | |
| 2002/0054209 A1 | 5/2002 | Obi | |
| 2005/0232479 A1 | 10/2005 | Obi | |
| 2009/0015279 A1 | 1/2009 | Cho | |
| 2010/0231248 A1 | 9/2010 | Cho | |
| 2011/0193582 A1 | 8/2011 | Cho | |
| 2012/0235695 A1 | 9/2012 | Cho | |

FOREIGN PATENT DOCUMENTS

| | | |
|---|---|---|
| JP | 2002-151555 A | 5/2002 |
| JP | 2006-337045 A | 12/2006 |
| JP | 2007-163463 A | 6/2007 |
| JP | 4008886 B2 | 11/2007 |
| JP | 2009-020105 A | 1/2009 |
| WO | WO-03/075023 A1 | 9/2003 |

* cited by examiner

*Primary Examiner* — Thomas F Valone
(74) *Attorney, Agent, or Firm* — Global IP Counselors, LLP

(57) ABSTRACT

An electronic component testing device includes a first imaging device for imaging an upper-surface electrode of an electronic component before the electronic component is held by a holding part, a second imaging device for imaging a contact terminal provided to a testing head, a third imaging device for imaging a lower-surface electrode of the electronic component held by the holding part, and a fourth imaging device for imaging a testing socket. A control device controls the position adjustment part of the testing head to adjust the position of the holding part, and thereby controlling, based on images captured by the first and second imaging devices, a holding orientation when the holding part holds the electronic component, and controlling, based on the images captured by the third and fourth imaging devices, a holding orientation of the holding part in relation to the testing socket.

12 Claims, 12 Drawing Sheets

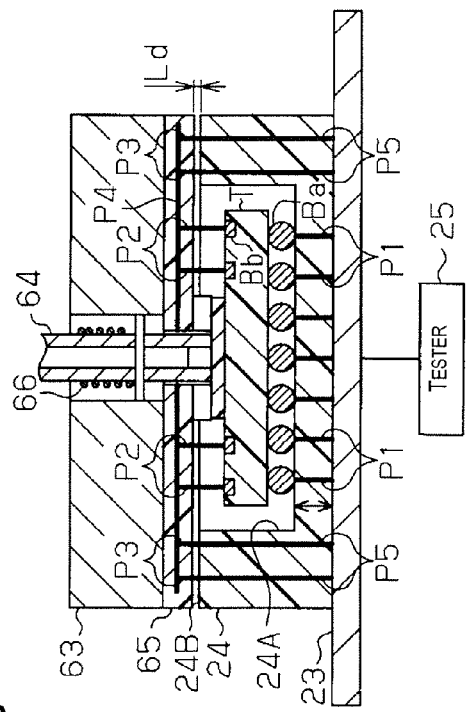
Fig. 7B
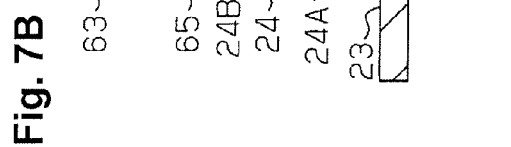
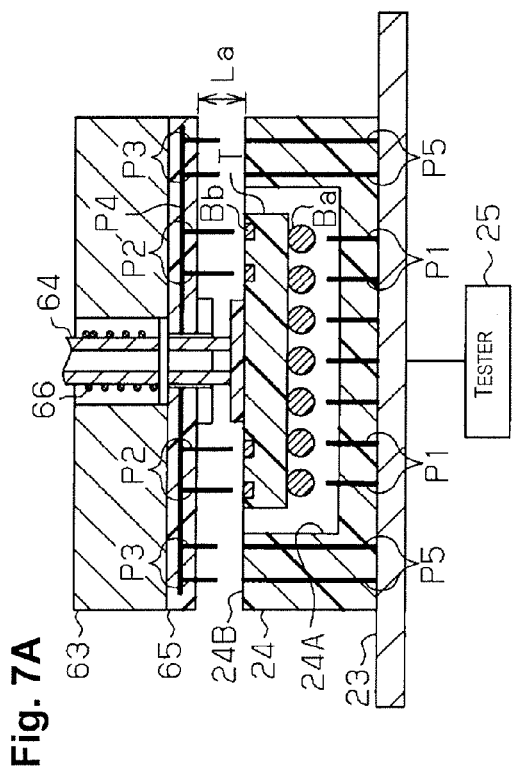
Fig. 7A
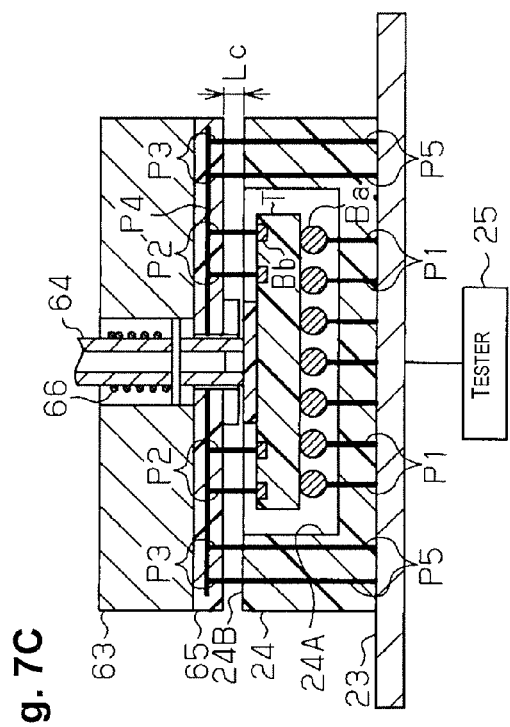
Fig. 7D
Fig. 7C

ELECTRONIC COMPONENT TESTING DEVICE AND ELECTRONIC COMPONENT TRANSPORT METHOD

CROSS-REFERENCE TO RELATED APPLICATIONS

This application claims priority to Japanese Patent Application No. 2010-111825 filed on May 14, 2010. The entire disclosure of Japanese Patent Application No. 2010-111825 is hereby incorporated herein by reference.

BACKGROUND

1. Technical Field

The present invention relates to an electronic component examination device for electrically testing a packaged semiconductor chip or other electronic component in which electrodes are provided to both surfaces, and to an electronic component transport method that uses the electronic component examination device.

2. Related Art

Generally, this type of electronic component testing device is designed to feed, test, and discharge a target electronic component in accordance with procedures such as those that follow. Specifically, (a) the electronic component is placed on a tray, is fed from the exterior of the electronic component testing device prior to being tested, and is fed to a testing head by being held and transported by the holding part; (b) the electronic component thus fed is arranged in a testing socket by the testing head; (c) the electronic component arranged in the testing socket is recovered by the testing head after testing has been carried out by the testing socket; (d) the recovered electronic component is distributed by the holding part to the tray that corresponds to the quality of the testing result, and is discharged together with the tray to the exterior of the electronic component testing device. It is apparent from such a procedure that it is particularly important in terms of maintaining proper testing in such an electronic component testing device that the electronic component be correctly arranged with predetermined precision in the testing socket via the testing head, in other words, that the electrodes of the electronic component be correctly connected to the testing terminals disposed in the testing socket.

In recent years, tests are commonly performed on small-scale and high-integration electronic components having a structure in which electrodes are provided to both the upper and lower surfaces as described above, and another electronic component stacked on the upper surface is connected to the electrodes of the upper surface of the underlying component (POP: package-on-package).

A conventional testing device for testing an electronic component having such a package-on-package structure is generally provided with a contact terminal with which an upper-surface electrode of the electronic component makes contact when the electronic component held by a holding part is positioned in a testing socket, and a connection terminal for connecting the contact terminal to an electrode of the testing substrate on which the testing socket is arranged. The upper-surface electrodes of the electronic component are connected to the electrodes of the testing substrate interposed by the contact terminal and the connect ion terminal, whereby the lower-surface electrodes of the electronic component arranged in the testing socket and connected to the testing substrate can be electrically tested together with the upper-surface electrodes via the upper- and lower-surface electrodes.

On the other hand, various techniques have been proposed for correctly connecting the electrodes of an electronic component having narrow spacing to the contact terminals of a testing socket in order to handle the electrode spacing of an electronic component made smaller by miniaturizing and increasing the integration of the electronic component; and an example thereof is described in Domestic Re-publication of PCT International Patent Application No. WO2003/075023.

With the testing device described in Domestic Re-publication of PCT International Patent Application No. WO2003/075023, a binding/non-binding switching mechanism is provided to the holding-side arm holding an electronic component, and the electronic component being held is imaged from below. The position of the electronic component is corrected based on imaging results by position correction means composed of a unit separate from the holding-side arm, and the electronic component is secured to the holding-side arm in the position corrected by the binding/non-binding switching mechanism. The electrodes of the electronic component positionally secured in this manner are made to be in contact with the contact terminal of the testing socket. It is thereby possible to maintain the positional relationship between the testing head and the electronic component with good precision, and the arrangement of the electronic component in the testing socket by the testing head can maintained with high precision.

SUMMARY

In accordance with the testing device described in Domestic Re-publication of PCT International Patent Application No. WO2003/075023, the connection between the lower-surface electrode of the electronic component and the contact terminal of the testing socket is kept at a predetermined precision by keeping the orientation of the electronic component in a predetermined orientation with respect to the testing head. However, with the device described in this publication, no consideration is given to an electronic component having the package-on-package structure described above as the target of testing. Therefore, application cannot be made to a testing device designed for testing an electronic component having a simple package-on-package structure. In other words, the issue remains in regard to how the relationship between the contact terminal and the connection terminal should be configured when the device described in this publication is used in combination with a testing device that is designed for testing an electronic component having a package-on-package structure.

The present invention was devised in view of such circumstances, it being an object thereof to provide an electronic component testing device capable of electrically testing with good precision an electronic component having electrodes on both the upper and lower surfaces, and an electronic component transport method used in the electronic component testing device.

An electronic component testing device according to a first aspect includes a testing socket, a testing head, first to fourth imaging devices and a control device. The testing socket is configured and arranged to receive an electronic component therein when the electronic component is to be electrically tested, the electronic component having a first-surface electrode on a first surface and a second-surface electrode on a second surface opposite from the first surface. The testing head is configured and arranged to transport and arrange the electronic component in the testing socket. The testing head has a holding part configured and arranged to hold the electronic component, a position adjustment part configured and arranged to adjust a position of the holding part, and a contact terminal that is provided to the holding part and is configured and arranged to make contact with the first-surface electrode of the electronic component held by the holding part. The first imaging device is configured and arranged to capture an image of the first-surface electrode of the electronic component before the electronic component is held by the holding part. The second imaging device is configured and arranged to capture an image of the contact terminal provided to the testing head. The third imaging device is configured and arranged to capture an image of the second-surface electrode of the electronic component held by the holding part. The fourth imaging device is configured and arranged to capture an image of the testing socket. The control device is configured to control the position adjustment part of the testing head to adjust the position of the holding part so that a holding orientation when the holding part holds the electronic component is controlled based on the images captured by the first and second imaging devices, and a holding orientation, with respect to the testing socket, of the holding part holding the electronic component is controlled based on the images captured by the third and fourth imaging devices.

A contact terminal capable of making contact with the first-surface electrode of the electronic component is directly provided to the holding part, whereby the positional relationship between the first-surface electrode of the held electronic component and the contact terminal is kept in a corresponding relationship as a matter of course when the holding part properly holds the electronic component. A position adjustment part for adjusting the position of the holding part is provided to the testing head, whereby the holding orientation when the holding part holds the electronic component, and the holding orientation of the holding part holding the electronic component with respect to the testing socket are optimally ensured and maintained via the orientation control described above carried out by the control device. Electrical conductivity between the testing socket and the contact terminal between the first- and second-surface electrodes of the electronic component can be ensured using such a configuration.

The electronic component testing device has a configuration in which a connection electrode for ensuring electrical conductivity with the first-surface electrode of the electronic component is provided further outside from an external periphery of the electronic component arranged in the testing socket, and a connection terminal capable of making contact with the connection electrode is provided to the holding part.

In the electronic component testing device as described above, a connection electrode is preferably disposed further outside from an external periphery of the electronic component arranged in the testing socket to ensure electrical conductivity with the first-surface electrode of the electronic component, and a connection terminal configured and arranged to make contact with the connection electrode being provided to the holding part.

In the electronic component testing device as described above, at least one of the first imaging device and the fourth imaging device is preferably provided to the testing head.

According to the aspect described above, the field of view of the first imaging device and the fourth imaging device move in accompaniment with the movement of a pressing device, so that the configuration is simplified and greater convenience is afforded.

In the electronic component testing device as described above, the first imaging device and the fourth imaging device are preferably a single, shared imaging device.

According to the aspect described above, the first and fourth imaging devices are shared; therefore, the number of imaging devices can be reduced and the number of components can be reduced.

In the electronic component testing device as described above, the second imaging device and the third imaging device are preferably a single, shared imaging device.

According to the aspect described above, the second and third imaging devices are shared; therefore, the number of imaging devices can be reduced and the number of components can be reduced.

In the electronic component testing device as described above, the holding part is preferably configured and arranged to hold the electronic component so that the contact terminal and the first-surface electrode of the electronic component are kept in a state of non-contact, and the second-surface electrode of the electronic component is preferably configured and arranged to make contact with the contact terminal of the testing socket when the testing head presses the electronic component held by the holding part against the testing socket, whereupon the contact terminal of the holding part that was held in the non-contact state makes contact with the first-surface electrode of the electronic component.

According to the aspect described above, the stability of the holding force applied by the holding part to the electronic component is maintained because the contact terminal of the holding part and the first-surface electrode of the electronic component are kept in a state of non-contact and pressed to the testing socket. Also, the non-contact state is overcome by application of the pressing force applied by the pressing device; i.e., the first-surface electrode of the electronic component and the contact terminal of the holding part make contact and are electrically connected.

An electronic component transport method according to another aspect is a method for transporting and arranging an electronic component in a testing socket for electrically testing the electronic component, using a testing head having a holding part for holding the electronic component provided with a first-surface electrode on a first surface and a second-surface electrode on a second surface opposite from the first surface, a position adjustment part for adjusting a position of the holding part, and a contact terminal that is provided to the holding part and is capable of making contact with the first-surface electrode of the electronic component held by the holding part, the electronic component transport method including: performing image-recognition of the first-surface electrode of the electronic component before the electronic component is held by the holding part, and recognizing a position of the first-surface electrode of the electronic component; performing image-recognition of the contact terminal provided to the testing head, and recognizing a position of the contact terminal; adjusting an orientation of the holding part via the position adjustment part of the testing head, and holding the electronic component in the holding part, so that the position of the contact terminal recognized in the performing of the image recognition of the contact terminal conforms to the position of the first-surface electrode of the electronic component recognized in the performing of the image-recognition of the first-surface electrode; performing image-recognition of the testing socket, and recognizing a position of the testing socket; performing image-recognition of the second-surface electrode of the electronic component held by the holding part, and recognizing a position of the second-surface electrode of the electronic component; and adjusting the orientation of the holding part via the position adjustment part of the testing head, and maintaining the orientation of the holding part for the electronic component to be arranged in the testing socket, so that the position of the second-surface electrode of the electronic component recognized in the performing of the image-recognition of the second-surface electrode conforms to the position of the testing socket recognized in the performing of the image-recognition of the testing socket.

The electronic component is optimally held in a holding part provided with a contact terminal capable of making contact with the first-surface electrode of the electronic component, whereby the positional relationship between the first-surface electrode of the held electronic component and the contact terminal is kept in a corresponding relationship as a matter of course. Through the use of a position adjustment part for adjusting the holding part in terms of its movement position in the direction parallel to the testing socket, its rotational position, or another position, the testing head optimally ensures and maintains the holding orientation when the holding part holds the electronic component, as well as the holding orientation of the holding part holding the electronic component in relation to the testing socket, via the aforedescribed orientation control performed by the control device. Electrical conductivity between the testing socket and the contact terminal between the first- and second-surface electrodes of the electronic component can be ensured by such a configuration.

In the electronic component transport method as described above, the testing head includes a connection electrode for ensuring electrical conductivity with the first-surface electrode of the electronic component provided further outside from the external periphery of the electronic component arranged in the testing socket, and a connection terminal capable of making contact with the connection electrode provided to the holding part. The electronic component transport method preferably further includes carrying out positioning of the connection terminal of the testing socket with respect to the connection electrode together with the arranging of the electronic component with respect to the testing socket.

With such a method, the connection terminal of the holding part electrically connected to the first-surface electrode of the electronic component is positioned at the connection electrode further outside the external periphery of the electronic component due to the arrangement of the electronic component in relation to the testing socket. Therefore, electrical testing of an electronic component having an ordinary package-on-package structure is made possible via the first-surface electrode and the second-surface electrode.

In the electronic component transport method as described above, the performing of the image-recognition of the first-surface electrode preferably includes performing image-recognition of a first reference mark provided in advance in a predetermined position in relation to a placement position of the electronic component, and recognizing the position of the first-surface electrode of the electronic component in relation to the first reference mark, and the performing of the image-recognition of the contact terminal preferably includes performing image-recognition of a second reference mark provided in advance to the testing head as a mark that is in a predetermined relative position with respect to the first reference mark, and recognizing the position of the contact terminal in relation to the second reference mark.

The position of the first-surface electrode of the electronic component and the position of the testing head can be positioned via the first reference mark and the second reference mark, respectively, by using such reference marks; and the orientation of the holding part can be more readily achieved.

In the electronic component transport method as described above, the performing of the image-recognition of the testing socket preferably includes performing image-recognition of a third reference mark provided in advance in a predetermined position in relation to the testing socket, and recognizing the position of the testing socket in relation to the third reference mark. The performing of the image-recognition of the second surface-electrode preferably includes performing image-recognition of a fourth reference mark provided in advance to the testing head as a mark that is in a predetermined relative position with respect to the third reference mark, and recognizing the position of the second-surface electrode of the electronic component in relation to the fourth reference mark.

The position of the testing socket and the position of the second-surface electrode of the electronic component held in the testing head can be positioned via the third reference mark and the fourth reference mark, respectively, by using such reference marks; and the orientation of the holding part can be more readily achieved.

In the electronic component transport method as described above, the performing of the image-recognition of the first-surface electrode preferably includes performing image-recognition of a first reference mark provided in advance in a predetermined position in relation to a placement position of the electronic component, and recognizing the position of the first-surface electrode of the electronic component in relation to the first reference mark, the performing of the image-recognition of the contact terminal preferably includes performing image-recognition of a second reference mark provided in advance to the testing head as a mark that is in a predetermined relative position with respect to the first reference mark, and recognizing the position of the contact terminal in relation to the second reference mark, the performing of the image-recognition of the testing socket preferably includes performing image-recognition of a third reference mark provided in advance in a predetermined position in relation to the testing socket, and recognizing the position of the testing socket in relation to the third reference mark, the performing of the image-recognition of the second surface-electrode preferably includes performing image-recognition of a fourth reference mark provided in advance to the testing head as a mark that is in a predetermined relative position with respect to the third reference mark and recognizing the position of the second-surface electrode of the electronic component in relation to the fourth reference mark, and the second reference mark and the fourth reference mark are the same reference mark.

The position of the first-surface electrode of the electronic component and the position of the testing head can be positioned via the first reference mark and the second reference mark, respectively, by using such reference marks; and the position of the testing socket and the position of the second-surface electrode of the electronic component held in the testing head can be positioned via the third reference mark and the fourth reference mark, respectively. The orientation of the holding part can thereby be more readily achieved. Also, the number of components can be reduced by sharing the second and fourth reference marks, and ease of use can be further improved.

In the electronic component transport method as described above, when the electronic component is arranged in relation to the testing socket, the electronic component is preferably pressed to the testing socket in a state in which the contact terminal is kept in a non-contact state in relation to the first-surface electrode of the electronic component held by the holding part, and the second-surface electrode of the electronic component preferably makes contact with the contact terminal of the testing socket by the pressing, whereupon the contact terminal of the testing head that was held in the non-contact state makes contact with the first-surface electrode of the electronic component.

In accordance with such a method, the stability of the holding force applied by the holding part to the electronic component is maintained because the contact terminal of the holding part and the first-surface electrode of the electronic component are kept in a state of non-contact and pressed to the testing socket. Also, the non-contact state is overcome by application of the pressing force applied by the pressing device, that is to say, the first-surface electrode of the electronic component and the contact terminal of the holding part make contact and are electrically connected.

BRIEF DESCRIPTION OF THE DRAWINGS

Referring now to the attached drawings which form a part of this original disclosure:

FIGS. 2A to 2C are schematic views showing an electronic component tested in the same embodiment, wherein FIG. 2A is a perspective view showing the lower-surface structure, FIG. 2B is a perspective view showing the upper-surface structure, and FIG. 2C is a side view showing the side-surface structure;

FIGS. 7A, 7B, 7C and 7D are cross-sectional views showing the cooperative relationship between the testing head and the testing socket of the same embodiment;

FIGS. 8A and 8B are schematic views showing the state of testing of the relative positional relationship between the head reference mark and the socket reference mark of the same embodiment, wherein FIG. 8A is a side view showing the side surface state and FIG. 8B is a plan view showing the planar state of the mark;

FIGS. 9A and 9B are schematic views showing the state of testing of the relative positional relationship between the head reference mark and the shuttle reference mark of the same embodiment, wherein FIG. 9A is a side view showing the side surface state and FIG. 9B is a plan view showing the planar state of the mark;

FIGS. 22A and 22B are views showing another embodiment of implementation of the mark structure used by the electronic component testing device according to the present invention, wherein FIG. 22A is a side view and FIG. 22B is a plan view.

DETAILED DESCRIPTION OF EXEMPLARY EMBODIMENTS

Figure 1:
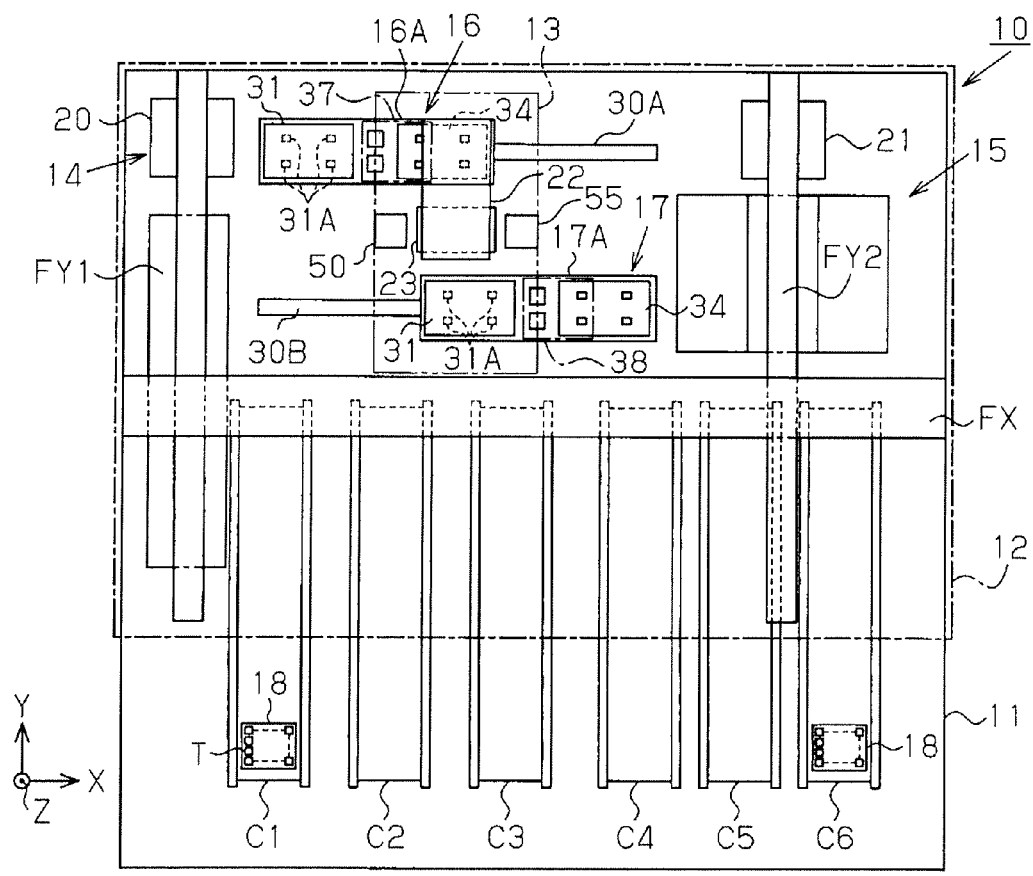
FIG. 1 is a plan view showing the entire structure of the first embodiment in which the electronic component testing device of the present invention has been implemented.
Figures 2A, 2B, 2C:
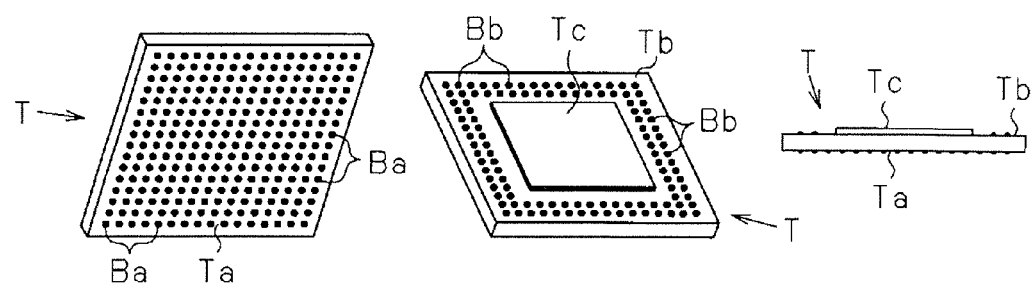
Figure 3:
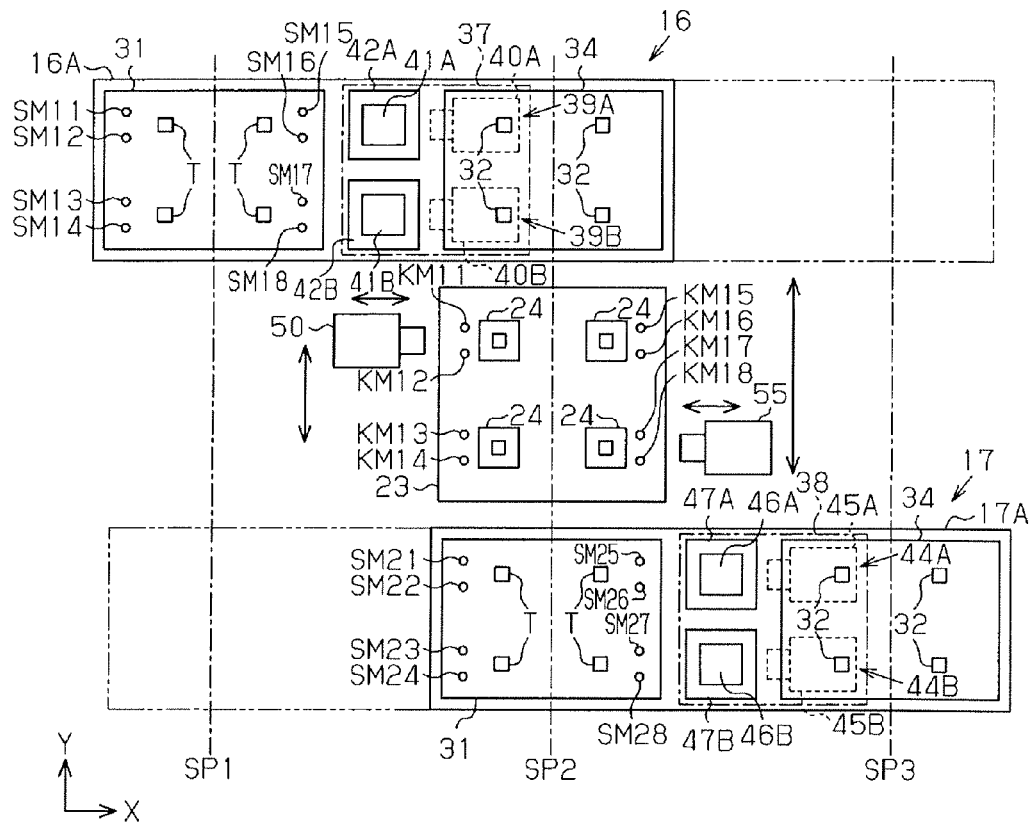
FIG. 3 is a schematic view showing the planar structure of a configuration in which the electronic component is transported to the testing socket of the same embodiment.

The first embodiment in which the electronic component testing device according to the present invention has been implemented will be described with reference to the drawings. FIG. 1 is a view showing an outline of the planar structure of the electronic component testing device 10. FIGS. 2A to 2C are schematic views showing the external shape of an electronic component to be tested in the electronic component testing device 10. FIG. 3 is a schematic view showing the mechanism by which the electronic component testing device 10 transports an electronic component to the testing socket.

The electronic component testing device 10 is provided with a base 11, a safety cover 12, a high-temperature chamber 13, a supply robot 14, a recovery robot 15, a first shuttle 16, a second shuttle 17, and a plurality of conveyors C1 to C6. The base 11 has the elements noted above mounted on its upper surface. The safety cover 12 surrounds a large area of the base 11, and the supply robot 14, recovery robot 15, first shuttle 16, and second shuttle 17 are accommodated inside the surrounded area.

The plurality of conveyors C1 to C6 are provided to the base 11 so that one end portion is positioned outside the safety cover 12 and the other end portion is positioned inside the safety cover 12. The conveyors C1 to C6 transport a tray 18 as a transport tray, on which a plurality of electronic components and other electronic components T are accommodated, from the outside of the safety cover 12 to the inside the safety cover 12; and conversely transport the tray 18 from the inside of the safety cover 12 to the outside of the safety cover 12.

In the present invention, the electronic components T have a plurality of lower-surface electrodes Ba provided with electroconductivity on a lower surface Ta, and a plurality of upper-surface electrodes Bb similarly provided with electroconductivity on an upper surface Tb, as shown in FIGS. 2A and 2B. The electronic components T are provided with a semiconductor chip Tc in the center of the upper surface Tb thereof; and the upper-surface electrodes Bb of the upper surface Tb are provided about the periphery of the semiconductor chip Tc. For example, the electronic components T are electronic components with the smaller, more highly integrated configuration employed in recent years, and have a structure (POP: package-on-package) in which other electronic components are stacked on the upper surface, and these other stacked electronic components are connected to the upper-surface electrodes Bb. The semiconductor chip Tc is not limited to a particular type, and may also be a silicon chip, resin module, or the like. The size of the semiconductor chip Tc is not particularly limited, and may be varied in accordance with recent miniaturization, e.g., a chip in which one side is 2 mm, a chip with a thickness of 0.3 (mm), or a chip having a larger or thicker shape, or conversely a chip that is smaller or thinner. An example of a smaller, thinner IC chip is WLCSP (wafer level chip size package). The electronic components T having such a miniaturized semiconductor chip Tc have an increasingly smaller external profile, and even narrower spacing between the lower-surface electrodes Ba, the upper-surface electrodes Bb, and other terminals.

The supply robot 14 is composed of an X-axis frame FX, a first Y-axis frame FY1, and a supply-side robot hand unit 20. The recovery robot 15 is composed of the X-axis frame FX, a second Y-axis frame FY2, and a recovery-side robot hand unit 21. The X-axis frame FX is arranged in the X-direction (lateral direction in FIG. 1, the direction parallel to the orientation of the X-direction arrow, and the direction orthogonal to the lengthwise direction of the plurality of conveyors C1 to C6). The first Y-axis frame FY1 and the second Y-axis frame FY2 are arranged so to be mutually parallel along the Y-direction (the vertical direction in FIG. 1, the direction parallel to the orientation of the Y-direction arrow, and the direction parallel to the lengthwise direction of the plurality of conveyors C1 to C6), and are moveably supported in the X-direction by the X-axis frame FX. The first Y-axis frame FY1 is moved in a reciprocating fashion in the X-direction along the X-axis frame FX by a motor (not shown) provided to the X-axis frame FX; and the second Y-axis frame FY2 is moved in a reciprocating fashion in the X-direction along the X-axis frame FX by a motor (not shown) provided to the X-axis frame FX.

The supply-side robot hand unit 20 is supported on the lower side of the first Y-axis frame FY1 so as to allow movement in the Y-direction, and the supply-side robot hand unit 20 is moved in a reciprocating fashion in the Y-direction along the first Y-axis frame FY1 by a motor (not shown) provided to the first Y-axis frame FY1.

The supply-side robot hand unit 20 is thereby moved above the electronic components T on the tray 18 of, e.g., the conveyor C1 and then made to chuck and hold the electronic components T accommodated on the tray 18 prior to testing. The supply-side robot hand unit 20 is moved above a change kit on the first shuttle 16 while being caused to chuck and hold the electronic components T, before being released and caused to supply the held electronic components T to the first shuttle 16.

The recovery-side robot hand unit 21 is supported below the second Y-axis frame FY2 so as to allow movement in the Y-direction, and the recovery-side robot hand unit 21 is moved in a reciprocating fashion in the Y-direction along the second Y-axis frame FY2 by a motor (not shown) provided to the second Y-axis frame FY2.

The recovery-side robot hand unit 21 is thereby moved, e.g., above the tested electronic components T on the first shuttle 16 and then made to chuck and move the electronic components T accommodated on the first shuttle 16. The recovery-side robot hand unit 21 is moved above the pocket of the tray 18 of the conveyor C6 while being caused to chuck and hold the electronic components T, and is then made to release and place the held electronic components T on the tray 18 of the conveyor C6.

A first rail 30A and a second rail 30B are disposed parallel to the X-direction on the top surface of the base 11 and between the supply robot 14 and the recovery robot 15. The first shuttle 16 is provided to the first rail 30A so as to allow reciprocating movement in the X-direction. The second shuttle 17 is provided to the second rail 30B so as to allow reciprocating movement in the X-direction.

The first shuttle 16 is provided with a substantially plate-shaped base member 16A that is long in the X-direction and that makes sliding contact with the first rail 30A via a rail receptor (not shown) on the bottom surface of the base member 16A. The first shuttle 16 is moved in a reciprocating fashion along the first rail 30A by a first shuttle motor MS1 (see FIG. 10) provided to the first shuttle 16. A supply change kit 31 is interchangeably secured by a screw or the like on the supply robot 14 side of an upper surface of the base member 16A, and a recovery change kit 34 is secured by a screw or the like on the recovery robot 15 side. The second shuttle 17 is provided with a substantially plate-shaped base member 17A that is long in the X-direction and that makes sliding contact with the second rail 30B via a rail receptor (not shown) on the bottom surface of the base member 17A. The second shuttle 17 is moved in a reciprocating fashion along the second rail 30B by a second shuttle motor MS2 (see FIG. 10) provided to the second shuttle 17. The supply change kit 31 is interchangeably secured by a screw or the like on the supply robot 14 side of the upper surface of the base member 17A, and the recovery change kit 34 is interchangeably secured by a screw or the like on the recovery robot 15 side. In other words, the supply change kit 31 moves in a reciprocating fashion between a parts supply position SP1 to which the electronic components T are supplied from the supply robot 14 and a parts holding position SP2 inside the high-temperature chamber 13 in accompaniment with the reciprocating movement of the first shuttle 16 and the second shuttle 17. The recovery change kit 34 moves in reciprocating fashion between the parts holding position SP2 and a parts recovery position SP3 where the electronic components T are recovered by the recovery robot 15.

Untested electronic components T are placed on the supply change kit 31 in a plurality of part placement positions 31A determined in advance, as shown in FIG. 3. A plurality of pockets 32 in which the tested electronic components T are accommodated are provided in the recovery change kit 34, and the electronic components T are held in the pocket 32. The electronic components T are thereby transported from the supply-side robot hand unit 20 of the supply robot 14 into the part placement positions 31A of the supply change kit 31, and the electronic components T are transported out from the pockets 32 of the recovery change kit 34 by the recovery-side robot hand unit 21 of the recovery robot 15.

In the present embodiment, cylindrically shaped shuttle reference marks SM11 to SM18 having a predetermined mark diameter are provided in protruding fashion on the supply robot 14 side on the upper surface of the supply change kit 31 so as to be aligned in two rows in the Y-direction. The shuttle reference marks SM11 to SM18 form pairs of two, i.e., the two shuttle reference marks SM11, SM12, the two shuttle reference marks SM13, SM14, each of the two shuttle reference marks SM 15, SM 16, and the two shuttle reference marks SM 17, SM 18 forms a pair. The spacing between the two shuttle reference marks SM11, SM12 (or SM13, SM14; or SM15, SM16; or SM17, SM18) constituting the pairs of shuttle reference marks is set to an inter-mark distance that is a predetermined distance in the Y-direction. Each of the pairs of shuttle reference marks SM11 to SM18 is set in correspondence to a nearby part placement position 31A.

Similarly, cylindrically shaped shuttle reference marks SM21 to SM28 having the same mark diameter as above are provided in protruding fashion on the upper surface of the supply change kit 31 of the second shuttle 17. The shuttle reference marks SM21 to SM28 form pairs of two, i.e., each of the two shuttle reference marks SM21, SM22, the two shuttle reference marks SM23, SM24, the two shuttle reference marks SM25, SM26, and the two shuttle reference marks SM27, SM28 forms a pair. The spacing between the two shuttle reference marks constituting the pairs of shuttle reference marks is set to an inter-mark distance that is the same distance as the inter-mark distance in the Y-direction noted above. Each of the pairs of shuttle reference marks SM21 to SM28 is set in correspondence to respective nearby part placement positions 31A.

Figure 4:
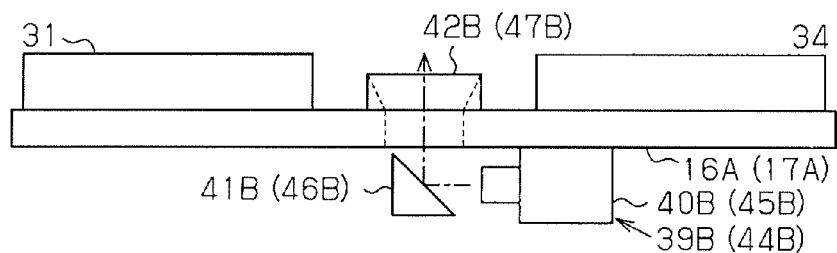
FIG. 4 is a front view showing the front surface structure of the shuttle of transporting the electronic component in the same embodiment.

A first shuttle imaging device 37 is provided to the base member 16A of the first shuttle 16. The first shuttle imaging device 37 is provided with a first upper imaging device 39A and a second upper imaging device 39B in parallel alignment in the Y-direction on the bottom surface of the base member 16A. The first upper imaging device 39A is composed of a camera 40A that faces the line of sight in the movement direction (X-direction) of the first shuttle 16, and a mirror 41A for upwardly refracting the line of sight of the camera 40A. The second upper imaging device 39B is also composed of a camera 40B that faces the line of sight in the movement direction (X-direction) of the first shuffle 16, and a mirror 41B for upwardly refracting the line of sight of the camera 40B, as shown in FIG. 4.

Each of the mirror 41A and mirror 41B is provided substantially in the center area in the X-direction of the base member 16A, and each has an aperture that does not block the lines of sight of the cameras 40A, 40B as refracted by the mirrors 41A, 41B, the apertures being formed substantially in the center part of the base member 16A. Rectangular frame-shaped illumination devices 42A, 42B for illuminating an imaging target ahead in the lines of sight are arranged on the periphery of the apertures, respectively.

A second shuttle imaging device 38 having the same configuration as the first shuttle imaging device 37 is provided to the base member 17A of the second shuttle 17. The second shuttle imaging device 38 is provided with a first upper imaging device 44A and a second upper imaging device 44B in parallel alignment in the Y-direction on the bottom surface of the base member 17A. In other words, the first upper imaging device 44A is composed of a camera 45A that faces the line of sight in the movement direction (X-direction) of the second shuttle 17, and a mirror 46A for upwardly refracting the line of sight of the camera 45A. The second upper imaging device 44B is also composed of a camera 45B that faces the line of sight in the movement direction (X-direction) of the second shuttle 17, and a mirror 46B for upwardly refracting the line of sight of the camera 45B, as shown in FIG. 4.

Each of the mirror 46A and mirror 46B is provided substantially in the center area in the X-direction of the base member 17A, and each has an aperture that does not block the lines of sight of the cameras 45A, 45B as refracted by the mirrors 46A, 46B, the apertures being formed substantially in the center part of the base member 17A. Rectangular frame-shaped illumination devices 47A, 47B for illuminating an imaging target ahead in the lines of sight are arranged on the periphery of the apertures, respectively.

A testing unit 23 is provided on the upper surface of the base 11 and between the first and second shuttles 16, 17, as shown in FIG. 3. Four testing sockets 24 in which electronic components T as the targets of testing are to be arranged are provided in the testing unit 23. The testing socket 24 is a socket for arranging the electronic components T as the testing targets, and the electronic components T placed in the part placement positions 31A of the shuttles 16, 17 are arranged in respective testing sockets 24.

Cylindrical socket reference marks KM11 to KM18 having a predetermined mark diameter similar to the shuttle reference marks SM11 to SM18 noted above provided in protruding fashion on the upper surface of the testing unit 23. The socket reference marks KM11 to KM18 form pairs of two, i.e., each of the two socket reference marks KM11, KM12, the two socket reference marks KM13, KM14, the two socket reference marks KM15, KM16, and the two socket reference marks KM17, KM18 forms a pair. The spacing between the two shuttle reference marks KM11, KM12 (or KM13, KM14; or KM15, KM16; or KM17, KM18) constituting the pairs of socket reference marks is set to an inter-mark distance that is the same distance in the Y-direction as the inter-mark distance noted above. Each of the pairs of socket reference marks is set in correspondence to a nearby testing socket 24.

The testing socket 24 is provided with an upper surface part 24B and an accommodation part 24A that is recessed in relation to the upper surface part 24B in order to accommodate an electronic component T, as shown in FIGS. 7A to 7D. A plurality of contact terminals P1 having electroconductivity is provided to the bottom surface of the accommodation unit 24A in an arrangement that corresponds to the arrangement of the lower surface electrodes Ba of the electronic component T. The contact terminals P1 make contact with the lower surface electrodes Ba that correspond to the electronic component T to connect the lower surface electrodes Ba to the tester 25, which is connected to the testing unit 23 via the circuitry of the testing unit 23. The contact terminals P1 can move vertically in relation to the bottom surface of the accommodation part 24A and are urged by a spring or the like from above with a predetermined pressure, and therefore have a known extension/contraction structure in which the distal ends thereof contract in length when pressed with a predetermined pressure or greater and the length of the distal ends is restored when the pressure is at a predetermined level or less. The contact terminals P1 can thereby be adjusted for distance between the lower surface electrodes Ba of the electronic component T, and can be brought into contact with the lower surface electrodes Ba using a predetermined pressure.

Connection electrodes P5 are provided to the upper surface part 24B of the testing socket 24. The connection electrodes P5 have base ends that are electrically connected to the circuitry of the testing unit 23, and distal ends that are exposed on the upper surface of the upper surface part 24B.

A rail (not shown) arranged in the Y-direction is provided inside the high-temperature chamber 13 so as to straddle the area above the testing unit 23 and the first and second shuttles 16, 17, as shown in FIG. 1.

A testing head 22 is supported on the lower part of the rail so as to be capable of reciprocating movement in the Y-direction, and the testing head 22 is moved in reciprocating fashion in the Y-direction between the shuttles 16, 17 by a Y-axis motor MY (see FIG. 10) provided to the rail. The testing head 22 thereby moves along the rail and transports electronic components T back and forth between the shuttles 16, 17 and the testing unit 23.

Figure 5:
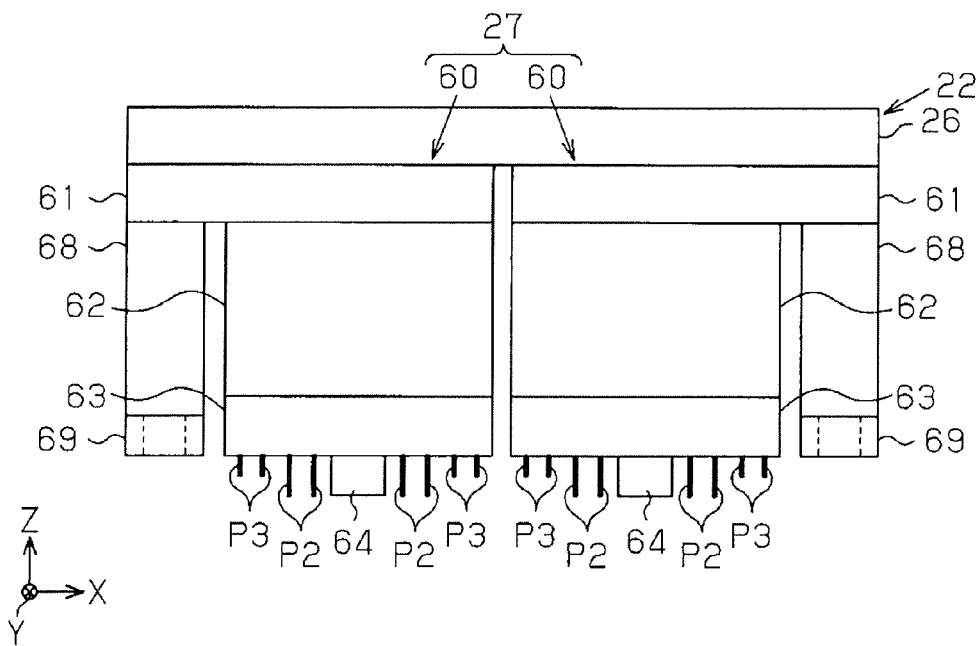
FIG. 5 is a front view showing the front surface structure of the testing head for transporting the electronic component in the same embodiment.

The testing head 22 is provided with a frame 26 that is movably connected to the rail, and a head unit 27 on the lower part of the frame 26, as shown in FIG. 5. A total of four pressing devices 60 are provided to the head unit 27, two in the X-direction and two in the Y-direction (shown only as two aligned in the X-direction in FIG. 5). The head unit 27 thereby transports the electronic components T between the first shuttle 16 and the testing unit 23, and transports the electronic components T between the second shuttle 17 and the testing unit 23. A plurality of head units 27 may be provided to the testing head 22.

The pressing device 60 has a base part 61 connected to the lower part of the frame 26, a position adjustment part 62 provided to the lower part of the base part 61, and a holding part 63 connected to the lower part of the position adjustment part 62. The position adjustment part 62 has therein a position adjustment mechanism for horizontally rotating (about the Z-axis) and horizontally moving (in the XY directions) the holding part 63 connected to the lower part of the position adjustment part in relation to the base part 61. Therefore, the holding part 63 is horizontally rotated and horizontally moved by the position adjustment part 62 in relation to the base part 61. A nozzle 64 is provided so as to protrude downward from the lower part of the holding part 63. The nozzle 64 has negative pressure or atmospheric pressure fed to the distal end (chucking surface) thereof, and the electronic components T in contact with the distal end thereof are chucked and held by the negative pressure (vacuum suction). The nozzle 64 thereby chucks and holds the electronic components T using the negative pressure fed to the chucking surface, and the electronic components T held by the chucking surface are released by atmospheric pressure fed to the chucking surface.

Figure 6:
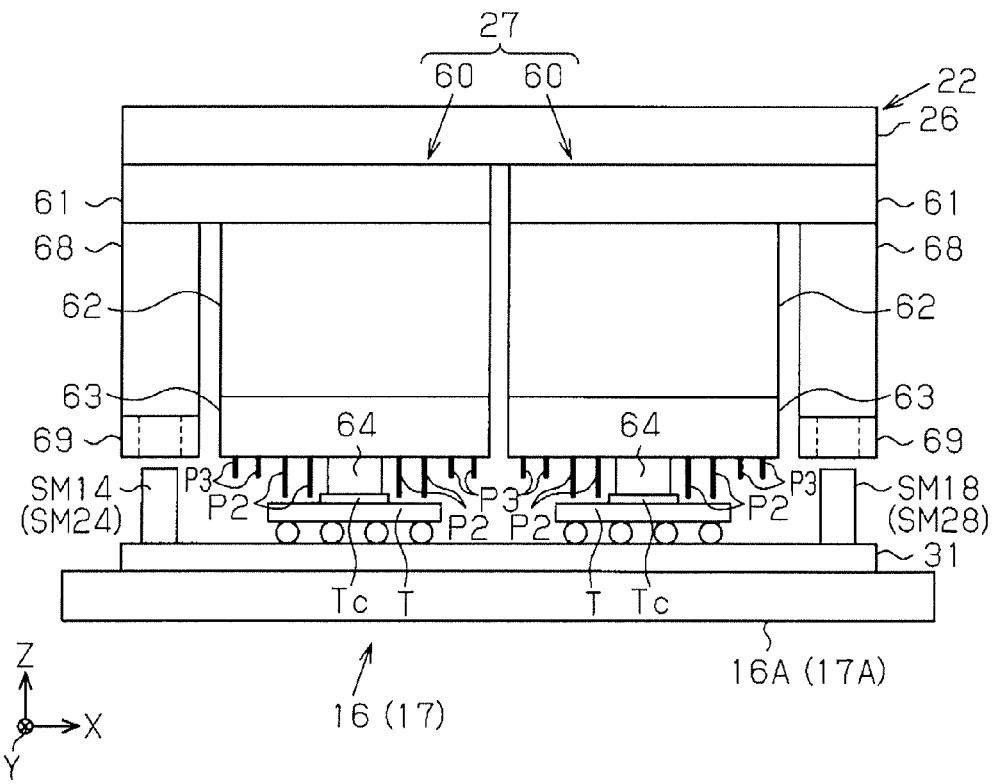
FIG. 6 is view showing the state of the cooperative relationship between the shuttle and the testing head of the same embodiment.

The pressing devices 60 are thereby arranged above the supply change kit 31 of the shuttles 16, 17 that are arranged in the parts holding position SP2, and as a result the nozzles 64 face the corresponding part placement position 31A (electronic component T), as shown in FIG. 6. The pressing devices 60 are moved (lowered) toward the supply change kit 31, whereby the nozzles 64 are brought into contact with a semiconductor chip Tc of the untested electronic components T arranged in the part placement positions 31A, and the electronic components T are chucked and held by the nozzles 64.

In the present embodiment, the nozzles 64 are urged downward to the holding parts 63 by an elastic body 66 provided between holding parts 63, as shown in FIGS. 7A to 7D. The nozzles 64 are thereby moved so to be accommodated inside the holding parts 63 in accordance with a greater pressing force than the urging force of the elastic body 66 received at the distal end from below, as shown in FIG. 7C.

The holding part 63 is provided with a holding-side circuit device 65 on the lower part thereof, as shown in FIGS. 7A to 7D. The holding-side circuit device 65 is used for electrically connecting the upper surface electrodes Bb of the electronic component T to the connection electrodes P5 of the testing socket 24 when the electronic component T is pressed to the testing socket 24. The holding-side circuit device 65 has the nozzle 64 inserted through the center thereof and has a plurality of contact terminals P2 and a plurality of connection terminals P3 having electroconductivity provided so as to protrude downward around the periphery of the nozzle 64.

The plurality of contact terminals P2 are electrically connected to the upper surface electrodes Bb of the electronic component T when the distal ends of the connection electrodes are brought into contact with the upper surface electrodes Bb of the upper surface Tb of the electronic component T, and are therefore provided on the lower part of the holding part 63 in an arrangement that corresponds to the upper surface electrodes Bb of the electronic component T. The contact terminals P2 have a known extension/contraction structure in which the distal ends thereof contract in length when pressed at a predetermined pressure or greater and the length of the distal ends is extended when the pressure is at a predetermined level or less. The contact terminals P2 thereby readily adjust the distance between the upper surface electrodes Bb of the electronic component T and make contact with the upper surface electrodes Bb of the electronic component T with a predetermined pressure. The contact terminals P2 are electrically connected to corresponding connection terminals P3 via circuit lines P4 inside the holding-side circuit device 65. The connection terminals P3 have the same structure as the contact terminals P2 described above, are electrically connected to the connection electrodes P5 of the testing socket 24 when the distal ends thereof make contact with the connection electrodes P5 of the testing socket 24, and are therefore provided on the lower part of the holding-side circuit device 65 in an arrangement that corresponds to the connection electrodes P5 of the testing socket 24. The length to which the connection terminals P3 protrude below the holding-side circuit device 65 is a length that is less than the length to which the contact terminals P2 protrude.

When the nozzle 64 holding the electronic component T is arranged above the testing socket 24 of the testing unit 23 by the pressing device 60, the electronic component T held by the nozzle 64 faces the corresponding testing socket 24, as Shown in FIG. 7A. At this point, the contact terminals P2 protruding from the holding-side circuit device 65 and the upper surface electrodes Bb of the electronic component T are kept in a non-contact state. When the pressing device 60 moves (descends) toward the testing unit 23, the electronic component T held by the nozzle 64 is arranged in the corresponding testing socket 24, and the lower surface electrodes Ba of the electronic component T are connected to the contact terminals P1 of the testing socket 24, as shown in FIG. 7B. When the pressing device 60 is further lowered, an upward force that is greater than the urging force from the elastic body 66 is applied, whereby the nozzle 64 moves upward in relation to the holding part 63, and the upper surface electrodes Bb of the electronic component T held at that location approach the holding-side circuit device 65, as shown in FIG. 7C. The upper surface electrodes Bb of the electronic component T thereby make contact with the contact terminals P2 protruding from the holding-side circuit device 65, and the connection terminals P3 protruding from the holding-side circuit device 65 make contact with the distal ends of the connection electrodes P5 exposed above the upper surface part 24B of the testing socket 24. When the pressing device 60 is further lowered, the electronic component T presses downward on the contact terminals P1 of the testing socket 24, whereby the electronic component T is mounted in the testing socket 24 in a manner in which the lower surface electrodes Ba are brought into contact with the corresponding contact terminals P1 with a predetermined pressing force, as shown in FIG. 7D.

The lower surface electrodes Ba of the electronic component T are thereby connected to the contact terminals P1 of the testing socket 24 and the tester 25 via the circuitry (not shown) of the testing unit 23, and the upper surface electrodes Bb of the electronic component T are connected to the tester 25 via the contact terminals P2, circuit lines P4, connection terminals P3, connection electrodes P5, and circuitry (not shown) of the testing unit 23. The lower surface electrodes Ba and upper surface electrodes Bb of the electronic component T are thus connected to the tester 25, whereby the electronic component T can be electrically tested by the tester 25 via the lower surface electrodes Ba and the upper surface electrodes Bb.

Due to this configuration, the testing head 22 acquires a plurality of electronic components T supplied by the supply change kit 31 of the shuttles 16, 17 using the head unit 27, and arranges the plurality of electronic components T in positions directly above the testing sockets 24 of the testing unit 23. The testing head 22 moves the plurality of acquired electronic components T downward and brings the lower surface electrodes Ba of the electronic components T into contact from above with the contact terminals P1 of the corresponding testing socket 24. The electronic components T with the lower surfaces Ta supported by the testing sockets 24 are correctly arranged in the holding-side circuit devices 65 when the upper surface electrodes Bb are brought into contact with the contact terminals P2 of the corresponding holding-side circuit device 65 and press the contact terminals P2 upward. Additionally, the lower surface electrodes Ba of the electronic components T press downward on the contact terminals P1 which are being urged upward, whereby the electronic components T are mounted in the testing sockets 24. Furthermore, when the electrical testing of the electronic components T mounted in the testing sockets 24 is completed, the testing head 22 removes the electronic components T mounted in the testing socket 24 and arranges them in positions directly above the corresponding recovery change kit 34. The testing head 22 moves the electronic components T downward in a position directly above the corresponding recovery change kit 34 and causes the electronic components to be accommodated in the predetermined pocket 32 of the corresponding recovery change kit 34.

Two rod-shaped support bodies 68 protrude downward from the base part 61 in alignment with the Y-direction so as to have predetermined spacing in the Y-direction, and the distal ends of the support bodies 68 are arranged in the vicinity of the holding part 63 along the X-direction side surface, which is the side surface that is not adjacent to the other pressing device 60, as shown in FIG. 5. A single mark body 69 is horizontally supported along the Y-direction on the distal ends of the support bodies 68. The mark body 69 is used for detecting the relative position of the holding parts 63 in relation to the base part 61 when the distance in the horizontal direction (XY directions) between holding parts 63 is compared. Therefore, the mark body 69 and the support bodies 68 that support the mark body 69 are provided so as to be kept in a state of non-contact with the holding part 63. A total of four mark bodies 69 are thus provided to the head unit 27 in correspondence to the pressing devices 60. Two head reference marks are provided to each of the mark bodies 69. The mark bodies 69 all have the same structure. Therefore, the mark bodies 69 that correspond to the pressing devices 60 arranged in positions on the right side in FIG. 5, i.e., on recovery robot 15 side and the second shuttle 17 side of the testing head 22, will be described here, and a description of the other mark bodies 69 will be omitted for convenience of description.

Figures 8A, 8B:
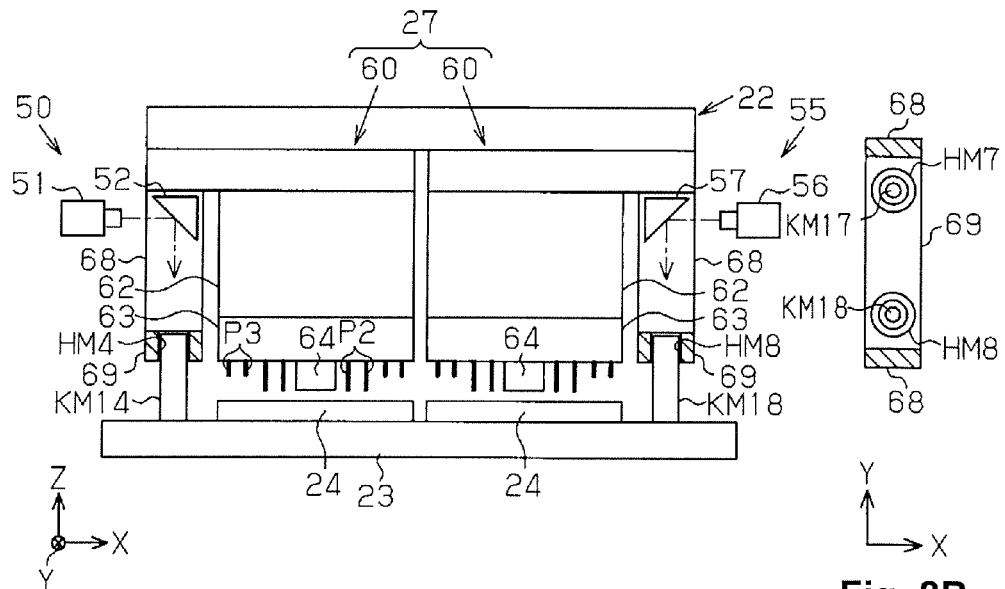

Two cylindrically shaped head reference marks HM7, HM8 having an inside diameter that is greater than the mark diameter of the shuttle reference marks and the socket reference marks are provided in the Y-direction to the mark body 69 so as to be set at a distance that is equal to an inter-mark distance, which is the same distance as the inter-mark distances of the shuttle reference marks and the socket reference marks, as shown in FIG. 8B. When the pressing device 60 is above the testing socket 24, the head reference marks HM7, HM8 of the mark body 69 of the pressing device 60 thereby correspond to the pair of socket reference marks KM17, KM18 of the testing unit 23. Also, when the pressing device 60 is above the part placement position 31A of the first shuttle 16, the head reference marks HM7, HM8 of the mark body 69 correspond to the pair of shuttle reference marks SM17, SM18 of the supply change kit 31. Furthermore, when the pressing device 60 is above the part placement position 31A of the second shuttle 17, the head reference marks HM7, HM8 of the mark body 69 correspond to the pair of shuttle reference marks SM27, SM28 of the supply change kit 31.

In this manner, the mark bodies 69 correspond to each pair of the socket reference marks of the testing unit 23, and also correspond to the pair of shuttle reference marks of the first shuttle 16 or the pair of shuttle reference marks of the second shuttle 17.

In accordance with the above, the head reference marks (HM4 or HM8) of the mark body 69 of each pressing device 60 are inserted through the socket reference marks (KM14 or KM18) of the testing unit 23 when the head unit 27 arranged above the testing unit 23 is moved (lowered) toward the testing socket 24, as shown in FIG. 8A. At this time, the socket reference mark KM17 of the testing unit 23 is inserted into the head reference mark HM7 of the mark body 69, and the socket reference mark KM18 of the testing unit 23 is inserted into the head reference mark HM8 of the mark body 69, as shown in FIG. 8B, for example.

The testing head 22 has a first lower imaging device 50 provided on the supply robot 14 side thereof, and a second lower imaging device 55 provided on the recovery robot 15 side, as shown in FIG. 1. The first and second lower imaging devices 50, 55 are supported via an image device frame (not shown) on the testing head 22 so as to allow movement in the X- and Y-directions in relation to the testing head 22. The first and second lower imaging devices 50, 55 are thereby movably controlled in the X- and Y-directions by a first or second horizontal drive device (see FIG. 10) provided to the image device frame, as shown in FIG. 3.

The first lower imaging device 50 is composed of a camera 51 provided so that the horizontal line of sight in the X-direction faces the direction of the pressing device 60, and a mirror 52 for refracting the line of sight of the camera 51 downward, which is the upper surface of the base 11, as shown in FIGS. 8A and 8B. Similarly, the second lower imaging device 55 is also composed of a camera 56 provided so that the horizontal line of sight in the X-direction faces the direction of the pressing device 60, and a mirror 57 for refracting the line of sight of the camera 56 downward, which is the upper surface of the base 11. The mirror 52 and mirror 57 are secured in positions relative to the cameras 51, 56, respectively, and therefore constantly direct the line of sight of the cameras 51, 56 toward the upper surface of the base 11.

The lower imaging devices 50, 55 thereby move above the testing unit 23 or above the supply change kit 31 of the shuttles 16, 17 by X- and Y-directional movement in relation to the image device frame, or Y-directional movement of the testing head 22 provided to the image device frame. The lower imaging devices 50, 55 can thereby image the testing socket 24 of the testing unit 23, the electronic component T (part placement position 31A) of the supply change kit 31, and other areas. The imaging ranges of the first lower imaging device 50 are separately set to the two testing sockets 24 on the supply robot 14 side among the four testing sockets 24 of the testing unit 23, and the imaging ranges of the second lower imaging device 55 are separately set to the two testing sockets 24 on the recovery robot 15 side. In relation to four electronic components T (part placement positions 31A) of the supply change kit 31 of the shuttles 16, 17, at least the imaging ranges of either of the first and second lower imaging devices 50, 55 are separately set for the electronic components T (part placement positions 31A) by the movement of the shuttles 16, 17. In the present embodiment, a single testing socket 24 and two socket reference marks corresponding to the testing socket 24 are simultaneously imaged in the imaging ranges of the first and second lower imaging devices 50, 55, and a single electronic component T (part placement position 31A) and two shuttle reference marks corresponding to the part placement positions 31A of the electronic component T are simultaneously imaged. In other words, the socket reference marks are arranged in positions that are simultaneously included in the imaging ranges of the first and second lower imaging devices 50, 55 in relation to the corresponding testing socket 24, and are arranged in positions that are simultaneously included in the imaging ranges of the first and second lower imaging devices 50, 55 in relation to the corresponding electronic component T (part placement position 31A).

In this manner, the image of the state in which the head reference marks and the socket reference marks have been combined (see FIG. 8B) is imaged by the first or second lower imaging device 50, 55, and the image is processed to thereby compute the relative positional relationship between the head reference marks and the socket reference marks. For example, the second lower imaging device 55 acquires an image of the state in which the head reference marks HM7, HM8 are combined with the socket reference marks KM17, KM18, as shown in FIG. 8B. The center coordinate of the two head reference marks HM7, HM8 and the center coordinate of the two socket reference marks KM17, KM18 are obtained by processing the image thus acquired. The offset distance in the horizontal direction between the head reference mark HM7 and the socket reference mark KM17 is thereby computed from a comparison of the two, and offset distance in the horizontal direction (XY directions) between the head reference mark HM8 and the socket reference mark KM18 is computed from a comparison of the two. The offset distance in the horizontal direction (XY directions) produced between the two head reference marks HM7, HM8 and the two socket reference marks KM17, KM18, and the offset angle in the direction of rotation with the axis perpendicular to the horizontal plane (XY plane) as the center of rotation is obtained (computation of the socket reference mark positions) based on the two offset distances thus computed. The position of the holding part 63 and the electronic component T thus determined is corrected by the position adjustment part 62 or the like based on the offset distance and offset angle determined in this manner. The position is thereby kept with good precision between the holding part 63 of the pressing device 60 having the head reference marks, or the electronic component T held by the holding part, and the testing socket 24 of the testing unit 23 having the socket reference marks.

Figures 9A, 9B:
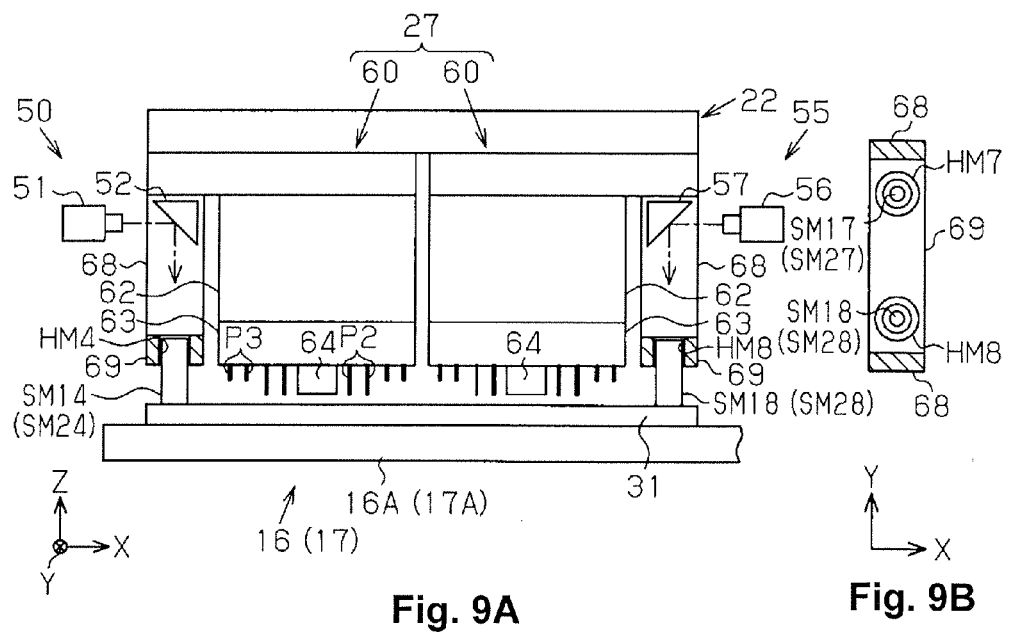

When the head unit 27 arranged above the first shuttle 16 or the second shuttle 17 is moved (lowered) toward the supply change kit 31, the head reference mark (HM4 or HM8) of the mark body 69 of each pressing device 60 is inserted into the shuttle reference mark (SM14, SM18, or the like) of the supply change kit 31, as shown in FIG. 9A. At this time, the shuttle reference mark SM17 (SM27) of the supply change kit 31 is inserted into the head reference mark HM7 of the mark body 69, and the head reference mark HM8 of the mark body 69 is inserted into the shuttle reference mark SM18 (SM28) of the supply change kit 31, as shown in FIG. 9B, for example.

In this manner, the image of the state in which the head reference marks and the shuttle reference marks have been combined (see FIG. 9B) is imaged by the first or second lower imaging device 50, 55, and the image is processed to thereby computed the relative positional relationship between the head reference marks and the shuttle reference marks. For example, the second lower imaging device 55 acquires an image of the state in which the head reference marks HM7, HM8 are combined with the shuttle reference marks SM17, SM18, as shown in FIG. 9B. The center coordinate of the two head reference marks HM7, HM8 and the center coordinate of the two shuttle reference marks SM17, SM18 are obtained by processing the image thus acquired. The offset distance in the horizontal direction (XY directions) between the head reference mark HM7 and the shuttle reference mark SM17 is thereby computed from a comparison of the two, and offset distance in the horizontal direction (XY directions) between the head reference mark HM8 and the shuttle reference mark SM18 is computed from a comparison of the two. The offset distance in the horizontal direction (XY directions) produced between the two head reference marks HM7, HM8 and the two shuttle reference marks SM17, SM18, and the offset angle in the direction of rotation with the axis perpendicular to the horizontal plane (XY plane) as the center of rotation is obtained (computation of the shuttle reference mark positions) based on the two offset distances thus computed. The position of the holding part 63 thus determined is corrected by the position adjustment part 62 or the like based on the offset distance and offset angle determined in this manner, whereby the position is kept with good precision between the holding part 63 of the pressing device 60 having the head reference marks, and the electronic component T (part placement position 31A) of the supply change kit 31 having the shuttle reference marks.

Figure 10:
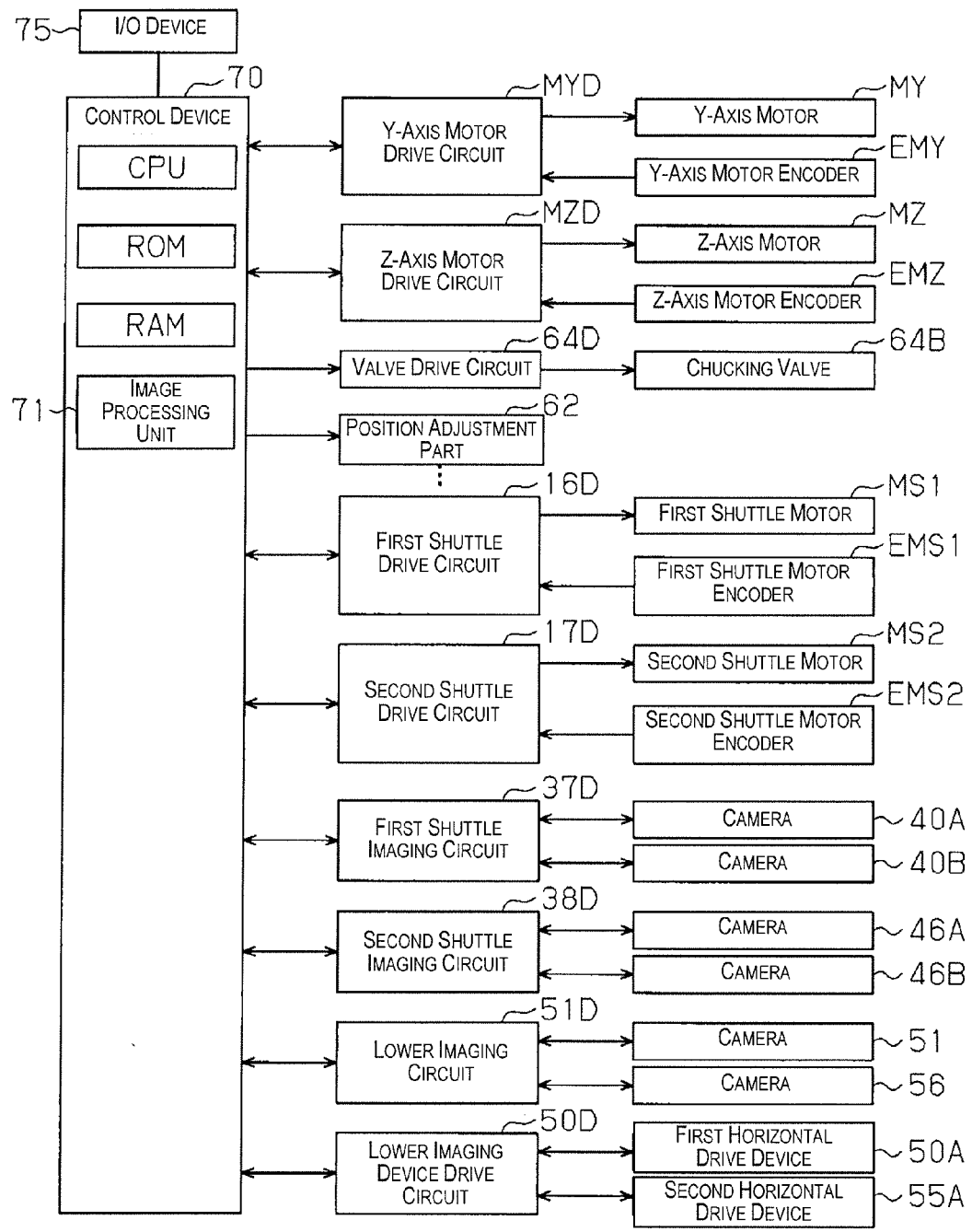
FIG. 10 is a block view showing in functional blocks the electrical configuration of the electronic component testing device of the same embodiment.

Next, the electrical configuration by which the electronic component testing device 10 transports the electronic component T to the testing socket 24 will be described with reference to FIG. 10.

The electronic component testing device 10 is provided with a control device 70. The control device 70 is mainly composed of a microcomputer having a central processing unit (CPU) and a storage device (nonvolatile memory ROM, volatile memory RAM, or the like); and carries out various controls for processing or the like for transporting the electronic components T and other devices based on various data and programs stored in memory. In the present embodiment, a process for computing and setting the relative positions between various elements constituting the electronic component testing device 10, a process for positioning between the various elements and the electronic component T, and other processes are carried out in the control device 70. Various parameters required for setting and processing the information of relative positions, controlling the pressing device 60, and other processing are stored in advance in the nonvolatile memory ROM.

The control device 70 is provided with an image processing unit 71 for processing the images imaged by the cameras 40A, 40B, 45A, 45B, 51, 56, and computing, e.g., the orientation of the electronic component T, the center position of the various marks, and the like. The image processing unit 71 has a program for computing the above-noted orientation, center position, and the like, and executes programs or the like to process the images acquired from the camera, compute the orientation of the recognized electronic component T, the center position of the reference marks, and the like, and store the results in predetermined memory or the like of the control device 70. Also, in the present embodiment, the image processing unit 71 carries out processes for the following sections to be described further hereunder: "Process for recognizing the orientation of the holding part," "Process for recognizing the orientation of the held electronic component," "Process for recognizing the orientation of the electronic component prior to being held," and "Process for recognizing the orientation of the testing socket."

The process for acquiring the electronic component T (process for acquiring an electronic component prior to being held) is thereby carried out in the control device 70 based on the orientation of the holding part 63 (nozzle 64) ascertained by the "Process for recognizing the orientation of the holding part," and the orientation of the electronic component T ascertained by the "Process for recognizing the orientation of the electronic component prior to being held." The process for arranging the electronic component T (process for arranging the electronic component held in the testing socket) is carried out based on the orientation of the electronic component T held by the nozzle 64 as ascertained by the "Process for recognizing the orientation of the electronic component prior to being held," and the orientation of the testing socket 24 ascertained by the "Process for recognizing the orientation of the testing socket."

In the computation of the position of the shuttle reference marks, the image processing unit 71 computes the relative position of the socket reference marks with respect to the head reference marks by processing the images of the head reference marks and the socket reference marks inserted into the head reference marks, as shown in FIG. 8B. Also, the image processing unit 71 computes the relative position of the shuttle reference marks with respect to the head reference marks by processing the images of the head reference marks and the shuttle reference marks inserted into the head reference marks. The relative positions obtained by these processes are set and stored (shuttle reference marks position settings, socket reference marks position settings) in the storage device or the like of the control device 70, and are read out by the central processing unit or the like from the storage device or the like in which the relative positions have been set and stored.

The control device 70 is electrically connected to an I/O device 75. The I/O device 75 has various switches and a status display, and outputs to the control device 70 command signals for starting the execution of the processing noted above, initial value data for executing the processing, and the like. In the present embodiment, information related to the dimensions and shapes of various electronic components and the various elements of the electronic component testing device 10, information related to the movement of the testing head 22 set in accordance with the type of electronic component T, and other information is set in the I/O device 75; and the information is outputted to the control device 70.

The control device 70 is electrically connected to the Y-axis motor drive circuit MYD and the Z-axis motor drive circuit MZD.

The Y-axis motor drive circuit MYD computes the drive distance in response to and based on drive signals received from the control device 70, and drives and controls the Y-axis motor MY based on the drive distance thus computed. The rotational speed of the Y-axis motor MY detected by a Y-axis motor encoder EMY via the Y-axis motor drive circuit MYD is inputted to the control device 70. The control device 70 thereby ascertains the position (Y coordinate) of the testing head 22 in the Y-direction. The control device 70 also obtains the offset in the Y-direction between the position (Y coordinate) in the Y-direction thus ascertained and the position of the first or second shuttle 16, 17, the testing socket 24, or another target position; and drives and controls the Y-axis motor MY so as to move the testing head 22 to the target position.

In this manner, the position of the testing head 22 in the Y-direction (Y coordinate) is computed from the signal from the Y-axis motor encoder EMY.

The Z-axis motor drive circuit MZD computes the drive distance based on and in response to drive signals received from the control device 70, and drives and controls the Z-axis motor MZ based on the drive distance thus computed. The rotational speed of the Z-axis motor MZ detected by a Z-axis motor encoder EMZ via the Z-axis motor drive circuit MZD is inputted to the control device 70. The control device 70 thereby ascertains the position (height) of the pressing device 60 of the testing head 22 in the vertical direction (Z-direction), obtains the offset between the ascertained height position and the target height position (the position in the vertical direction), and drives and controls the Z-axis motor MZ to move the pressing device 60 to the target height position. For example, the nozzle 64 can thereby be moved to predetermined heights for holding and arranging electronic components T.

The control device 70 is electrically connected to the position adjustment parts 62 provided to the pressing devices 60. The position adjustment part 62 moves the holding part 63 (nozzle 64) provided to the pressing device 60 in the X-direction (lateral direction) and the Y-direction (depth direction) in relation to the base part 61 of the pressing device 60, and rotates the holding part 63 (nozzle 64) with respect to the XY plane (horizontal plane), in response to a control signal received from the control device 70. The position of the nozzle 64 and the electronic component T held by the nozzle 64 in relation to the holding part 63 is corrected thereby. FIG. 10 depicts only one position adjustment part 62, but the other position adjustment parts 62 are omitted from the drawing for convenience of description.

The control device 70 is electrically connected to a valve drive circuit 64D. The valve drive circuit 64D drives and controls a chucking valve 64B in response to a control signal received from the control device 70. The chucking valve 64B driven and controlled by the control device 70 switches the gas fed to the nozzle 64 to negative pressure gas or to atmospheric pressure gas. The nozzle 64 chucks the electronic component T when negative pressure gas is fed, and releases the electronic component T when atmospheric pressure gas is fed and the vacuum is broken.

The control device 70 is electrically connected to the first shuttle drive circuit 16D and the second shuttle drive circuit 17D.

The first shuttle drive circuit 16D drives and controls a first shuttle motor MS1 in response to a control signal received from the control device 70. The control device 70 drives the first shuttle motor MS1 to cause the first shuttle 16 to move along the rail 30A. The control device 70 receives input of the rotational speed of the first shuttle motor MS1 detected by a first shuttle encoder EMS1 via the first shuttle drive circuit 16D, and ascertains the position of the first shuttle 16 based on the detected rotational speed.

The second shuttle drive circuit 17D drives and controls a second shuttle motor MS2 in response to a control signal received from the control device 70. The control device 70 drives the second shuttle motor MS2 to cause the second shuttle 17 to move along the second rail 30B. The control device 70 receives input of the rotation speed of the second shuttle motor MS2 detected by a second shuttle encoder EMS2 via the second shuttle drive circuit 17D, and ascertains the position of the second shuttle 17 based on the detected rotational speed.

The control device 70 is electrically connected to a first shuttle imaging circuit 37D and a second shuttle imaging circuit 38D.

The first shuttle imaging circuit 37D drives and controls the cameras 40A, 40B in response to a control signal received from the control device 70. Similarly, the second shuttle imaging circuit 38D drives and controls the cameras 45A, 45B in response to a control signal received from the control device 70. The control device 70 acquires the upper images imaged by the camera 40A, 40B, 45A, 45B; e.g., an image G3 containing the mark body 69 (head reference marks) and the holding part 63 (see FIG. 18), and an image G4 containing the mark body 69 (head reference marks) and the electronic component T held by the holding part 63 (see FIG. 20), and other image data. The nozzle 64 of the holding part 63, the contact terminals P2 and connection terminals P3 of the holding-side circuit device 65 of the holding part 63, the mark body 69, and the head reference marks of the mark body 69 are imaged in the image G3. The image G3 is subjected to recognition processing whereby the center position DC of the nozzle 64, the arrangement positions of the contact terminals P2 and connection terminals P3, the position of the head reference marks, the relative positional relationships therebetween, and the like are acquired. The electronic component T, the lower surface electrodes Ba of the electronic component T, the connection terminals P3 of the holding-side circuit device 65 of the holding part 63, the mark body 69, and the head reference marks of the mark body 69 are imaged in the image G4. The image G4 is subjected to recognition processing, whereby the position of the electronic component T, the arrangement positions of the lower surface electrodes Ba of the electronic component T, the arrangement position of the connection terminals P3, the position of the head reference marks, the relative positional relationships therebetween, and the like are acquired.

In other words, the image G3 of the mark body 69 and the holding part 63 undergoes image processing by the image processing unit 71, whereby the orientation of the holding part 63 in relation to the mark body 69 (head reference marks) is recognized based on the arrangement of the contact terminals P2 of the holding-side circuit device 65 ("Process for recognizing the orientation of the holding part"). The image G4 of the mark body 69 and the electronic component T chucked to the holding part 63 undergoes image processing by the image processing unit 71, whereby the orientation of the electronic component T chucked to the holding part 63 in relation to the mark body 69 (head reference marks) is recognized based on the arranged of the lower surface electrodes Ba of the electronic component T ("Process for recognizing the orientation of the held electronic component").

The control device 70 is electrically connected to a lower imaging circuit 51D. The lower imaging circuit 51D drives and controls the cameras 51, 56 in response to a control signal received from the control device 70. The control device 70 acquires image data of the lower images taken by the cameras 51, 56. The image data is, e.g., an image G2 containing shuttle reference marks (SM13, SM14, and the like) and the upper surface Tb of the electronic component T placed in the part placement position 31A (see FIG. 16), and an image G1 (see FIG. 13) containing socket reference marks (KM13, KM14, and the like) and the testing socket 24 (head reference mark). The image G2 contains the electronic component T placed on the part placement position 31A, the upper surface electrodes Bb of the electronic component T, and the shuttle reference marks that correspond to the part placement position 31A.

The image G2 undergoes recognition processing to thereby acquire the position of the electronic component T placed on the part placement position 31A, the arrangement position of the upper surface electrodes Bb of the electronic component T, the position of the shuttle reference marks, the relative positional relationships therebetween, and the like. The image G1 contains the contact terminals P1 of the testing socket 24 and the socket reference marks that correspond to the testing socket 24. The image G1 undergoes recognition processing to thereby acquire the arrangement positions of the contact terminals P1 of the testing socket 24, the position of the shuttle reference marks, the relative positional relationships therebetween, and the like.

In other words, the image G2 of the shuttle reference marks and the electronic component T undergoes image processing by the image processing unit 71, whereby the orientation of the electronic component T in relation to the shuttle reference marks is recognized based on the upper surface electrodes Bb of the electronic component T ("Process for recognizing the orientation of the electronic component prior to being held"). Also, the image G1 of the socket reference marks and the testing socket 24 undergoes image processing by the image processing unit 71, whereby the orientation of the testing socket 24 in relation to the socket reference marks is recognized based on the contact terminals P1 of the testing socket 24 ("Process for recognizing the orientation of the testing socket").

The control device 70 acquires an image (corresponding to FIG. 8B) containing, e.g., the head reference marks (HM7, HM8) and the socket reference marks (KM17, KM18), as imaged by the cameras 51, 56; an image (corresponding to FIG. 9B) containing the head reference marks (HM7, HM8) and the shuttle reference marks (SM17, SM18); and other image data. In other words, in the process for setting the positions of the reference marks, the image (corresponding to FIG. 8B) of the head reference marks and the socket reference marks undergoes recognition processing by the image processing unit 71, whereby the relative positional relationship of the socket reference marks in relation to the head reference marks is computed as a predetermined value. Also, the image (corresponding to FIG. 9B) of the head reference marks and the shuttle reference marks undergoes recognition processing by the image processing unit 71, whereby the relative positional relationship of the shuttle reference marks in relation to the head reference marks is computed as a predetermined value.

The control device 70 is electrically connected to a lower imaging device drive circuit 50D. The lower imaging device drive circuit 50D drives and controls a first or second first horizontal drive circuit 50A, 55A in response to a control signal received from the control device 70. The control device 70 drives the first horizontal drive circuit 50A to thereby cause the first lower imaging device 50 to move in the XY direction (horizontal movement) with respect to the testing head 22, and drives the second horizontal drive device 55A to thereby cause the second lower imaging device 55 to move in the XY direction (horizontal movement) with respect to the testing head 22.

Described next is the orientation and recognition processing carried out by the electronic component testing device 10 when an electronic component T is transported.

Process for Recognizing Orientation of Testing Socket

The Process for recognizing the orientation of the testing socket will be described with reference to the drawings. FIG.

Figure 12:
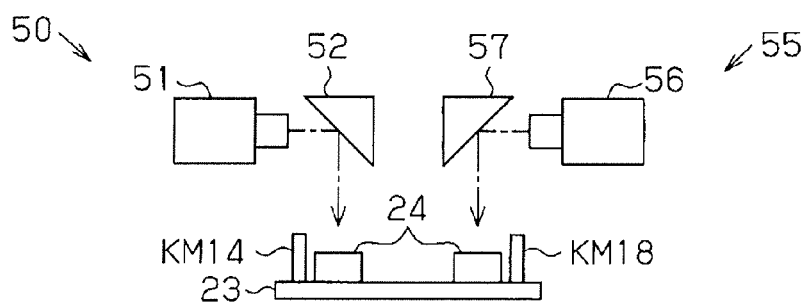
FIG. 12 is a front view schematically showing the front surface structure of a mode according to the orientation recognition processing of the testing socket of the same embodiment.
Figure 13:
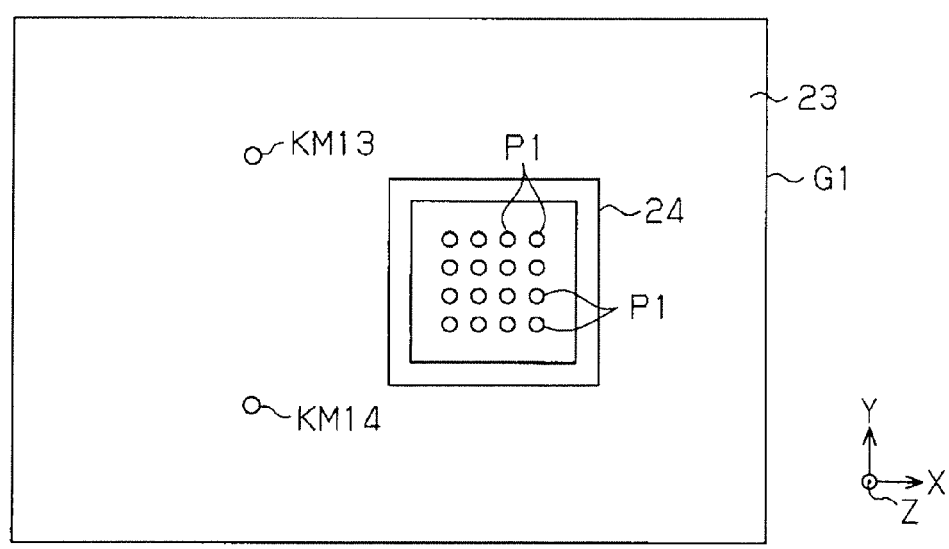
FIG. 13 is a schematic view schematically showing an image used in the orientation recognition processing of the testing socket of the same embodiment.

11 is a plan view showing the planar mode of imaging the testing sockets 24 and the socket reference marks KM11 to KM18 corresponding to the testing sockets 24. FIG. 12 is a front view showing the front mode of imaging the testing sockets 24 and the socket reference marks KM11 to KM18 corresponding to the testing sockets 24. FIG. 13 is a view showing an example of an image of the testing socket 24 and socket reference marks imaged by the lower imaging device.

Figure 11:
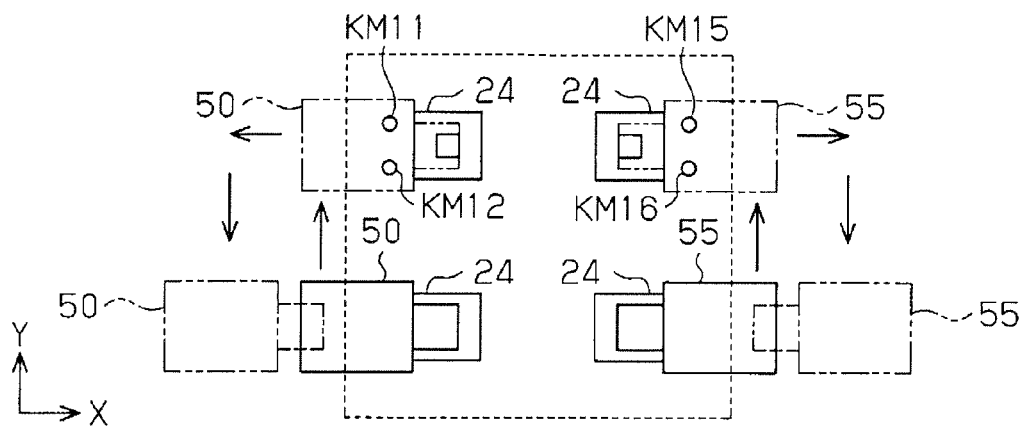
FIG. 11 is a plan view showing the planar structure of a mode according to the orientation recognition processing of the testing socket of the same embodiment.

In the Process for recognizing the orientation of the testing socket 24, the first and second lower imaging devices 50, 55 are sequentially arranged above each of the testing sockets 24 by the XY direction movement (horizontal movement) of the first and second lower imaging devices, and by the Y-direction movement and Z-direction movement of the testing head 22, as shown in FIG. 11. In other words, the first lower imaging device 50 is sequentially arranged above the two testing sockets 24 of the supply robot 14 side (left side), and the testing sockets 24 facing the respective arranged positions are imaged together with the pair of socket reference marks (e.g., KM13, KM14) that corresponds to the testing socket 24, as shown in FIG. 12. Similarly, the second lower imaging device 55 is sequentially arranged above the two testing sockets 24 of the recovery robot 15 side (right side), and the testing sockets 24 facing the respective arranged positions are imaged together with the pair of socket reference marks (e.g., KM17, KM18) that corresponds to the testing socket 24, as shown in FIG. 12. The image (e.g., G1) corresponding to each testing socket 24 is thereby acquired, as shown in FIG. 13. The "Process for recognizing the orientation of the testing socket" is carried out in the control device 70 based on acquired image (G1), and the orientation of the testing socket 24 using the socket reference marks as a reference is computed based on the arrangement of the contact terminals P1 of the testing socket 24. The orientation of the testing socket 24 thus computed, i.e., the arrangement of the contact terminals P1 is used for adjusting the orientation of the electronic component T arranged in the testing socket 24.

Figure 14:
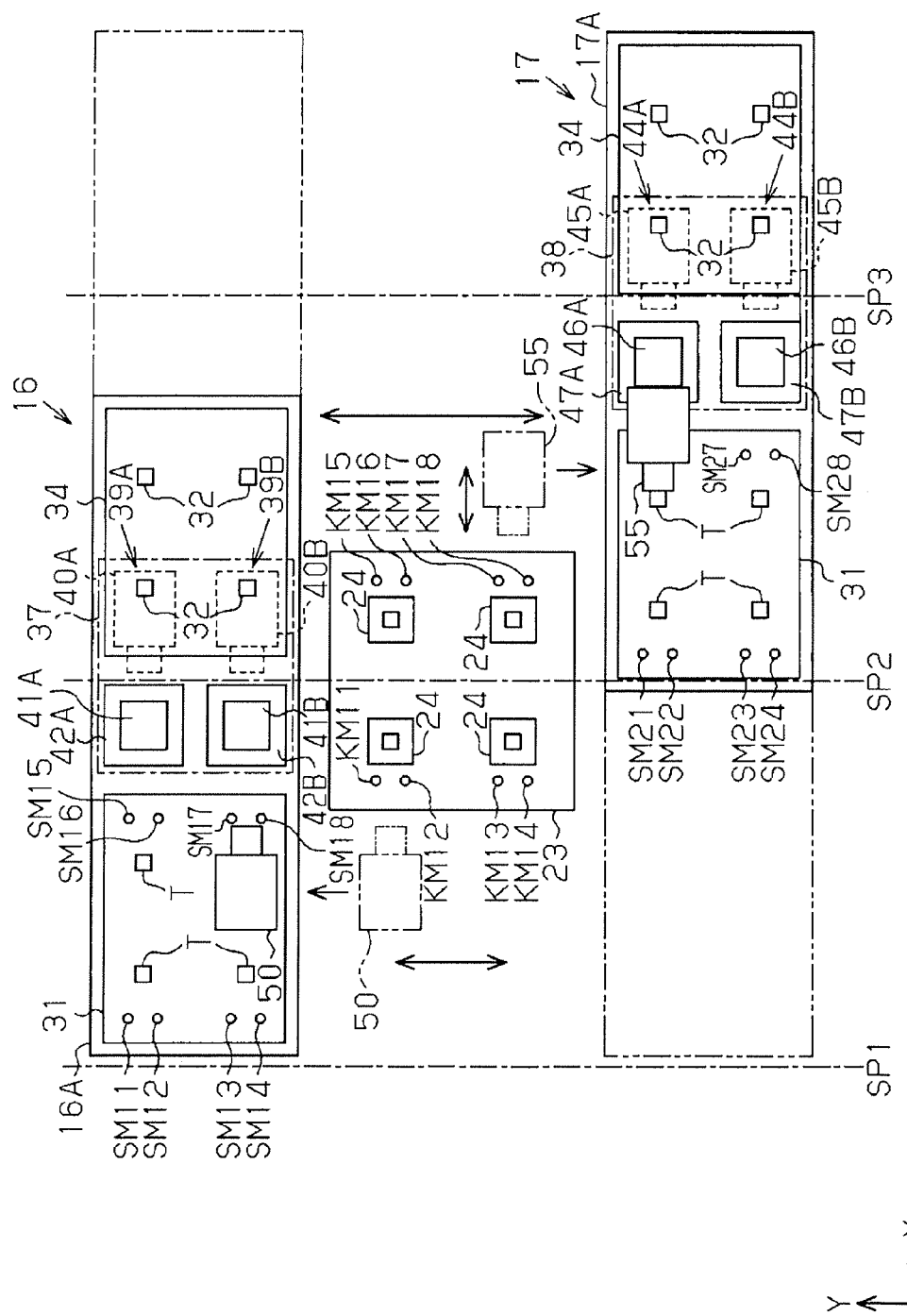
FIG. 14 is a plan view showing the planar structure of a mode according to the orientation recognition processing of the electronic component placed on the change kit of the shuttle of the same embodiment.
Figure 15A:
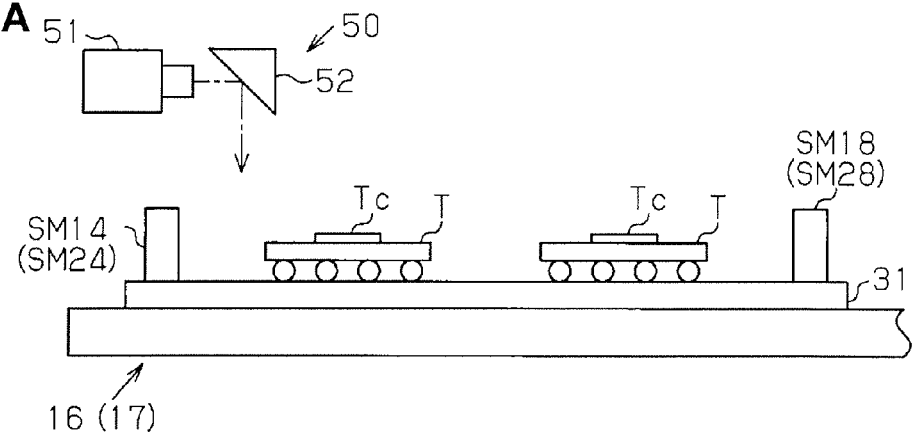
FIGS. 15A and 15B are front views schematically showing a mode according to the orientation recognition processing of the electronic component placed on the change kit of the shuttle of the same embodiment.
Figure 15B:
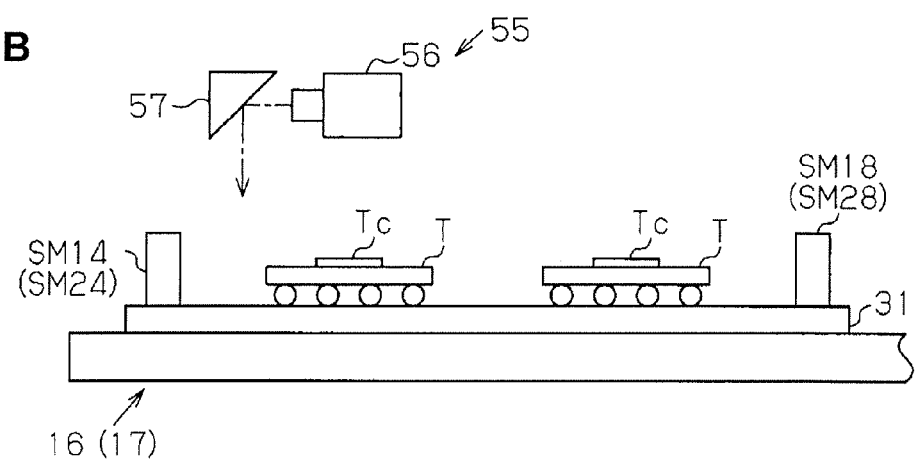
Figure 16:
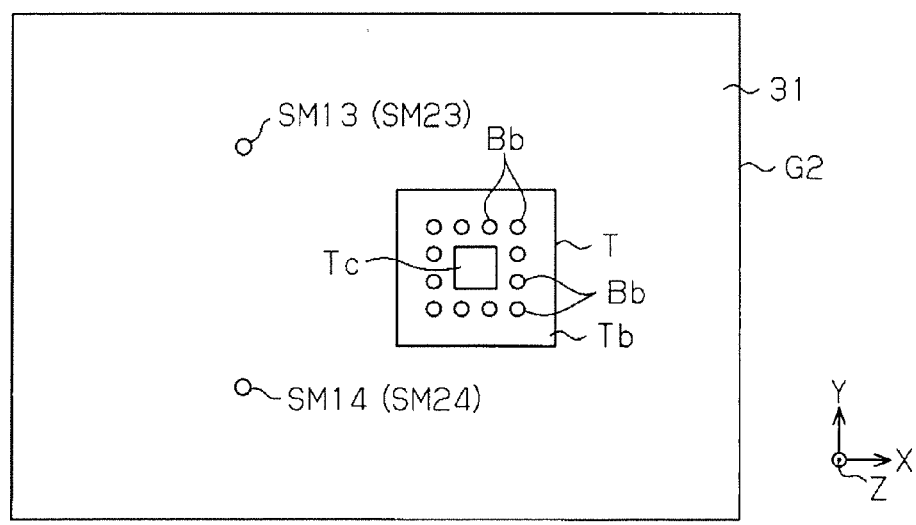
FIG. 16 is a schematic view schematically showing an image used in the orientation recognition processing of the electronic component placed on the change kit of the shuttle of the same embodiment.

Process for Recognizing Orientation of Electronic Component Arranged in Shuttle Change Kit The Process for recognizing the orientation of the electronic component arranged in the shuttle change kit will be described with reference to the drawings. FIG. 14 is a plan view showing a planar mode of imaging the upper surface electrodes Bb of the electronic component T placed in the part placement positions 31A and the shuttle reference marks SM11 to SM18 corresponding to the part placement positions 31A. FIGS. 15A and 15B are front views showing the front mode of imaging the upper surface electrodes Bb of the electronic component T placed in the part placement positions 31A and the shuttle reference marks SM11 to SM18 corresponding to the part placement positions 31A. FIG. 16 is a view showing an example of an image of the upper surface electrodes Bb of the electronic component T placed in the part placement positions 31A and the shuttle reference marks imaged by the lower imaging device.

In the process for recognizing an electronic component T arranged in the part placement position 31A, the first and second lower imaging devices 50, 55 are arranged above the supply change kit 31 of the shuttles 16, 17 by the XY direction movement (horizontal movement) of the first and second lower imaging devices, and by the Y-direction movement and Z-direction movement of the testing head 22, as shown in FIG. 14. For example, the first lower imaging device 50 is sequentially arranged above the part placement positions 31A of the supply change kit 31 of the first shuttle 16, as shown in FIG. 15A. The electronic components T arranged in the part placement positions 31A facing in each of the arranged positions are imaged together with the pair of shuttle reference marks (e.g., SM13, SM14) that correspond to the part placement positions 31A. The second lower imaging device 55 is sequentially arranged above the supply change kit 31 of the second shuttle 17, as shown in FIG. 15B, and the electronic components T arranged in the part placement positions 31A facing in each of the arranged positions are imaged together with the pair of shuttle reference marks (e.g., SM23, SM24) that correspond to the part placement positions 31A. The image (e.g., G2) corresponding to each part placement position 31A is thereby acquired, as shown in FIG. 16. "Process for recognizing the orientation of the electronic component prior to being held" is carried out in the control device 70 based on acquired image (G2), and the orientation of the electronic components T placed in the part placement positions 31A in which the shuttle reference marks are used as a reference is computed based on the arrangement of the upper surface electrodes Bb of the electronic component T. The orientation of the electronic components T thus computed, i.e., the arrangement of the upper surface electrodes Bb of the electronic component T is used for adjusting the orientation of the holding part 63.

In this manner, in the present embodiment, the first and second lower imaging devices 50, 55 are shared in the "Process for recognizing the orientation of the testing socket" and the "Process for recognizing the orientation of the electronic component arranged in the shuttle change kit."

Process for Recognizing Orientation of Holding Part

Figure 17:
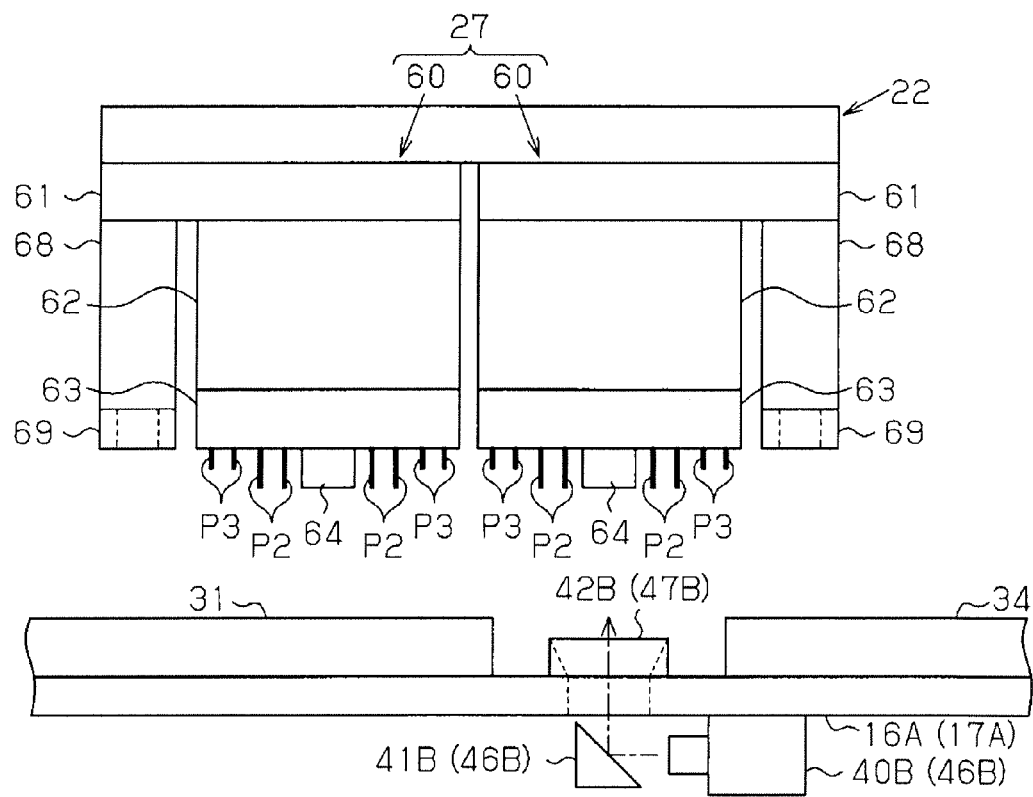
FIG. 17 is a front view schematically showing the front structure of a mode according to the orientation recognition processing of the testing head of the same embodiment.
Figure 18:
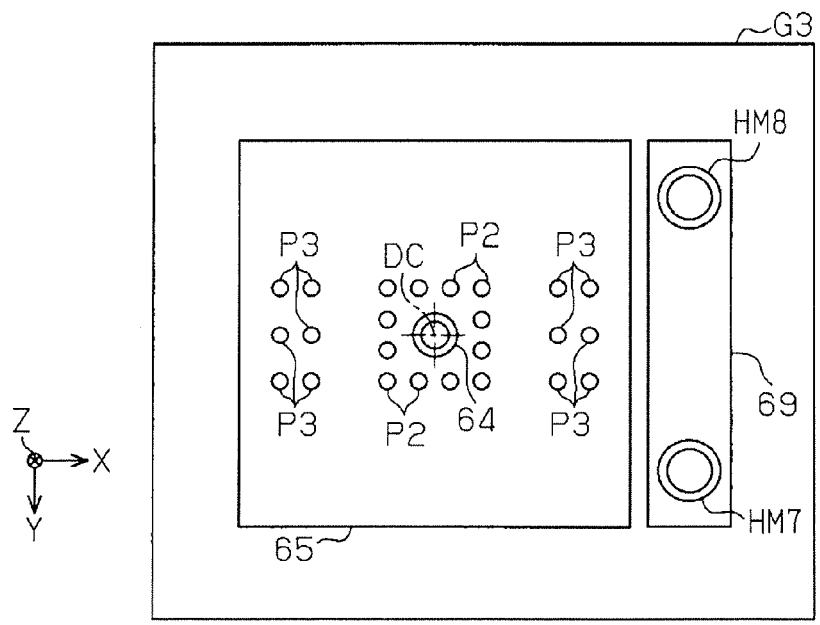
FIG. 18 is a schematic view schematically showing an image used in the orientation recognition processing of the testing head of the same embodiment.

The Process for recognizing the orientation of the holding part will be described with reference to the drawings. FIG. 17 is a front view showing a mode for imaging the mark body 69 (head reference marks) and the corresponding holding part 63, and FIG. 18 is a view showing an example of an image of the mark body 69 (head reference marks) and the holding part 63 (holding-side circuit device 65) imaged by the second upper imaging device 39B (44B).

In the Process for recognizing the orientation of the holding part 63, the holding part 63 is arranged above the first or second shuttle imaging device 37, 38 by the Y-direction movement of the testing head 22, and the movement of the first or second shuttle imaging device 37, 38, as shown in FIG. 17. For example, two holding parts 63 aligned in the Y-direction among the four pressing devices 60 provided to the hand unit of the testing head 22 are arranged above the first and second upper imaging devices 39A, 39B, respectively, of the first shuttle imaging device 37. The first and second upper imaging devices 39A, 39B thereby image the contact terminals P2 and connection terminals P3 of the holding-side circuit device 65 of the holding part 63 together with the pair of head reference marks (e.g., HM7, HM8) that corresponds to the holding part 63. This is carried out for the number of pressing devices 60 aligned in the X-direction, i.e., two times. The images (e.g., G3) that correspond to the holding part 63 (holding-side circuit devices 65) are thereby acquired, as shown in FIG. 18. "Process for recognizing the orientation of the holding part" is carried out in the control device 70 based on acquired images (G3), and the orientation of the holding-side circuit device 65 in which the head reference marks are used as a reference is computed based on the arrangement of the contact terminals P2 of the holding-side circuit device 65.

The calculated orientation of the holding-side circuit device 65, i.e., the orientation of the holding part 63 is adjusted based on the arrangement of the contact terminals P2.

Figure 19:
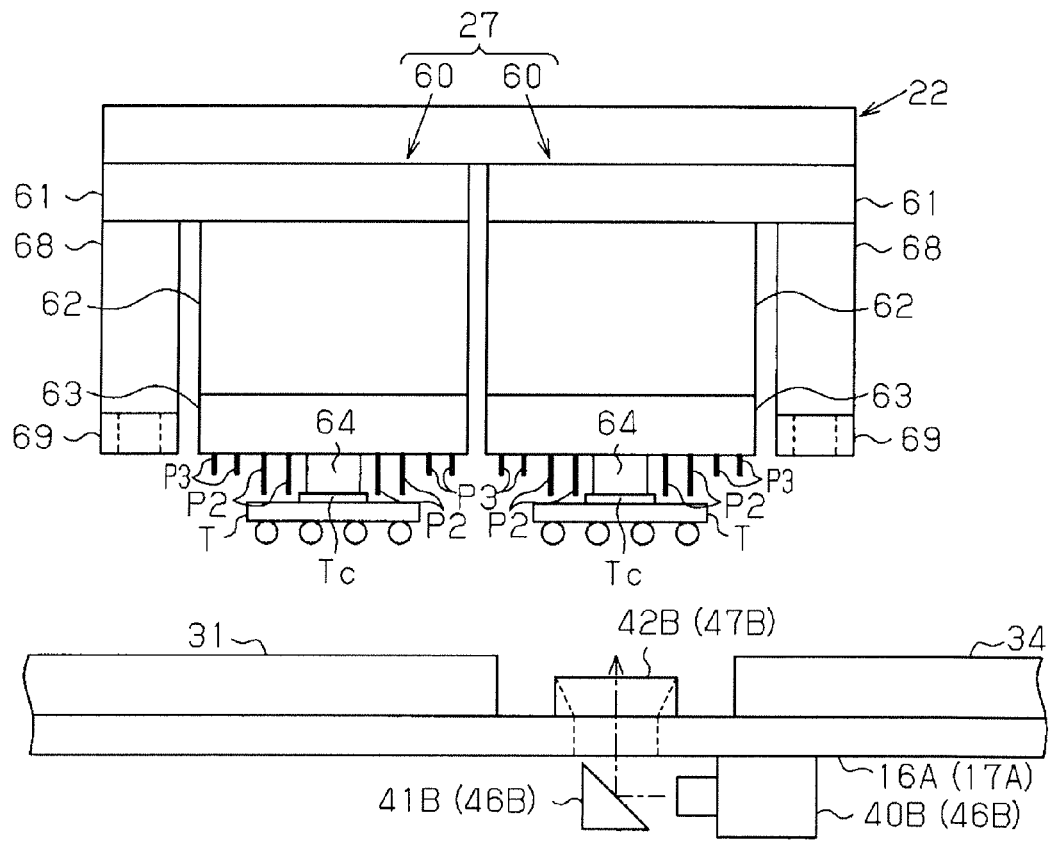
FIG. 19 is a front view schematically showing the front surface structure of a mode according to the orientation recognition processing of the electronic component held by the testing head of the same embodiment.
Figure 20:
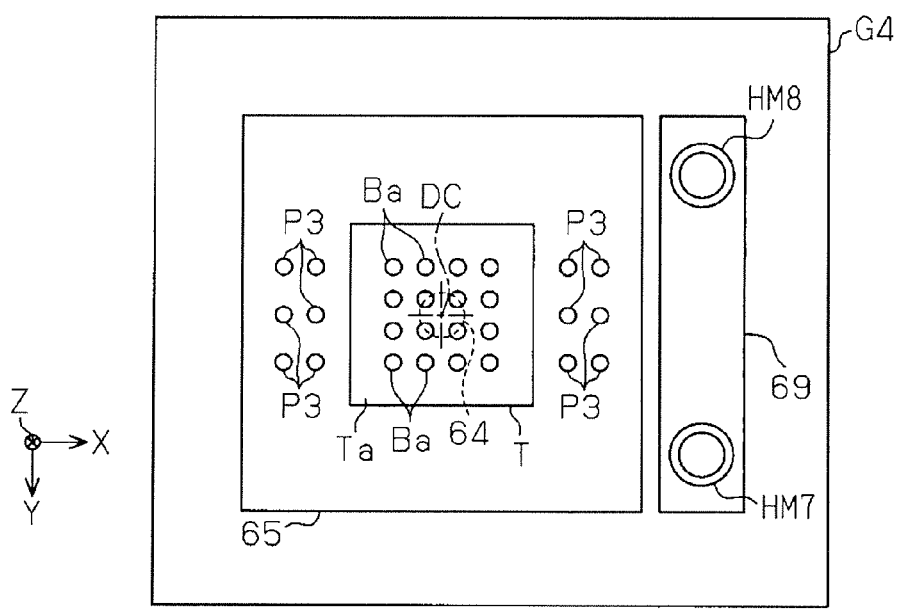
FIG. 20 is a schematic view schematically showing an image used in the orientation recognition processing of the electronic component held by the testing head of the same embodiment.

Process for Recognizing Orientation of Electronic Component Held in Holding Part Process for recognizing the orientation of the electronic component held in the holding part will be described with reference to the drawings. FIG. 19 is a front view showing a mode for imaging the mark body 69 (head reference marks) and the electronic component T held in the corresponding holding part 63; and FIG. 20 is a view showing an example of an image of the electronic component T acquired by the holding part 63 and the mark body 69 (head reference marks) imaged by the second upper imaging device 39B (44B). In other words, the mark body 69 (head reference marks) are used in both the "Process for recognizing the orientation of the holding part" and "Process for recognizing the orientation of the electronic component held in the holding part."

In the Process for recognizing the orientation of the electronic component T held by the holding part 63, the holding part 63 is arranged above the first or second shuttle imaging device 37, 38 by the Y-direction movement of the testing head 22, and the movement of the first or second shuttle imaging device 37, 38, in a state in which the electronic component T is held in the holding part 63, as shown in FIG. 19. For example, two holding parts 63 aligned in the Y-direction among the four pressing devices 60 provided to the hand unit of the testing head 22 are arranged above the first and second upper imaging devices 39A, 39B, respectively, of the first shuttle imaging device 37, whereby the electronic component T held by the holding part 63 is imaged together with the pair of head reference marks (e.g., HM7, HM8) that corresponds to the holding part 63. This is carried out a number of times equal to the number of pressing device 60 aligned in the X-direction, i.e., two times. The images (e.g., G4) that correspond to the electronic component T held by the holding part 63 are thereby acquired, as shown in FIG. 20. "Process for recognizing the orientation of the held holding part" is carried out in the control device 70 based on acquired images (G4), and the orientation of the electronic component T held in the holding part 63 in which the head reference marks are used as a reference is computed based on the arrangement of the lower surface electrodes Ba of the electronic component T. The calculated orientation of the electronic component T, i.e., the orientation of the holding part 63 is adjusted based on the arrangement of the lower surface electrodes Ba.

In the present embodiment, the first or second shuttle imaging device 37, 38 is thus used in both the "Process for recognizing the orientation of the holding part" and the "Process for recognizing the orientation of the electronic component held by the holding part."

Procedure for Transporting Electronic Component to Testing Socket

Figure 21:
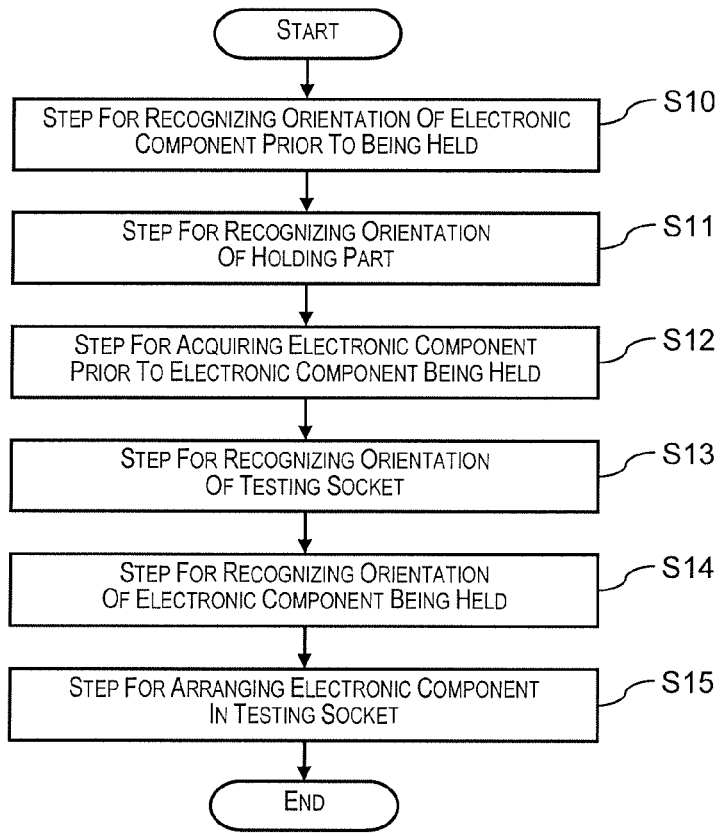
FIG. 21 is a flowchart showing an outline of the steps by which the testing head transports and arranges an electronic component in the testing socket in the same embodiment.

Next, the procedure by which the electronic component testing device 10 transports the electronic component T to the testing socket 24 using the testing head 22 will be described with reference to the drawings. FIG. 21 is a flowchart showing the outline of the procedure for transporting the electronic component T to the testing socket 24.

The control device 70 carries out a step for recognizing the orientation of the electronic component T prior to being held as a first step (step S10 of FIG. 21), and a step for recognizing the orientation of the holding part 63 as a second step (step S11 of FIG. 21), as shown in FIG. 21. The control device 70 carries out a step for causing the orientation of the holding part 63 to conform to the orientation of the electronic component T to acquire the electronic component T as a third step (step S12 of FIG. 21). The control device 70 furthermore carries out a step for recognizing the orientation of the testing socket 24 as a fourth step (step S13 of FIG. 21), and a step for recognizing the orientation of the electronic component T held by the holding part 63 as a fifth step (step S14 of FIG. 21). The control device 70 also carries out a step for causing the orientation of the electronic component T held in the holding part 63 to conform to the orientation of the testing socket 24 to arrange the electronic component T in the testing socket 24 as a sixth step (step S15 of FIG. 21).

In the step for recognizing the orientation of the electronic component T (step S10 of FIG. 21), the control device 70 recognizes the orientation of the electronic component T based on the arrangement of the upper surface electrodes Bb of the electronic component T by way of the "Process for recognizing the orientation of the electronic component arranged in the shuttle change kit" described above.

In the step for recognizing the orientation of the holding part 63 (step S11 of FIG. 21), the control device 70 recognizes the orientation of the holding part 63 based on the arrangement of the contact terminals P2 provided to the holding part 63 (holding-side circuit device 65) by way of the "Process for recognizing the orientation of the holding part" described above.

In the step for causing the orientation of the holding part 63 to conform to the orientation of the electronic component T and acquiring the electronic component T using the holding part 63 (step S12 of FIG. 21), the control device 70 moves the holding part 63 to directly above the electronic component T. The holding part 63 is positioned at the electronic component T based on the relative positional relationship between the shuttle reference marks of the shuttle 16 (17) and the head reference marks of the mark body 69 in which the relative position relationship has been set to a predetermined value by the "Setting of the position of the shuttle reference marks," based on the orientation of the electronic component T obtained in step S10, and based on the orientation of the holding part 63 obtained in step S12. The orientation of the holding part 63 and the orientation of the electronic component T are in a positional relation which the upper surface electrodes Bb of the electronic component T and the contact terminals P2 of the holding-side circuit device 65 face each other (conform). Therefore, the upper surface electrodes Bb make contact with the facing contact terminals P2 when the electronic component T is pressed to the holding-side circuit device 65 side. In other words, the contact terminals P2 and the upper surface electrodes Bb can be positionally matched because the orientation of the holding part 63 (holding-side circuit device 65) is recognized using the contact terminals P2 and the orientation of the electronic component T is recognized using the upper surface electrodes Bb.

The holding part 63 positioned with respect to the orientation of the electronic component T causes the nozzle 64 to make contact with the electronic component T and hold the electronic component T by lowering the pressing device 60 from above the electronic component T. The electronic component T is thereby held by the holding part 63 so that the upper surface electrodes Bb of the electronic component T faces the contact terminals P2 of the holding-side circuit device 65. The orientation of the electronic component T having been chucked and held by the nozzle 64 does not vary in relation to the nozzle 64 as long as the electronic component T is not released from the nozzle 64.

In the step for recognizing the orientation of the testing socket 24 (step S13 of FIG. 21), the control device 70 recognizes the orientation of the testing socket 24 based on the arrangement of the contact terminals P1 of the testing socket 24 by way of the "Process for recognizing the orientation of the testing socket."

In the step for recognizing the orientation of the electronic component T held by the holding part 63 (step S14 of FIG. 21), the control device 70 recognizes the orientation of the electronic component T held by the holding part 63 based on the arrangement of the lower surface electrodes Ba of the electronic component T by way of the "Process for recognizing the orientation of the electronic component held by the holding part" described above.

In the step for causing the orientation of the electronic component T held by the holding part 63 to conform to the orientation of the testing socket 24 and arranging the electronic component T held by the holding part 63 (step S15 of FIG. 21), the control device 70 moves the electronic component T held by the holding part 63 to directly above the testing socket 24. The control device 70 changes the orientation of the holding part 63 based on the orientation of the testing socket 24 obtained in step S13 and the orientation of the held electronic component T as obtained in step S14, and positions the electronic component T so as to be oriented relative to the testing socket 24. At this time, the control device 70 corrects the position used for positioning, by using the relative positional relationship between the head reference marks of the mark body 69 and the socket reference marks of the testing unit 23 in which the relative positional relationship has been set to a predetermined value by the "Setting of the position of the shuttle reference marks." The orientation of the testing socket 24 and the orientation of the electronic component T are thereby set in a positional relationship in which the contact terminals P1 of the testing socket 24 and the lower surface electrodes Ba of the electronic component T faces each other (conform). Therefore, the lower surface electrodes Ba make contact with the facing contact terminals P1 when the electronic component T is lowered and pressed to the testing socket 24. The lower surface electrodes Ba and the contact terminals P1 can be positionally matched because the orientation of the holding part 63 is recognized using the lower surface electrodes Ba of the electronic component T and the orientation of the testing socket 24 is recognized using the contact terminals P1.

The entire pressing device 60 is lowered, thereby bringing the electronic component T positioned with respect to the testing socket 24 into contact with and arranged in the testing socket 24. The lower surface electrodes Ba of the electronic component T held by the holding part 63 are thereby connected to the contact terminals P1 of the testing socket 24.

Also, at this time, a reaction force is applied upward on the nozzle 64 via the electronic component T in accompaniment with the pressing of the electronic component T on the testing socket 24. The reaction force upwardly applied to the nozzle 64 acts against the urging force of the elastic body 66 which urges the nozzle 64 downward, and the electronic component T also moves to the holding-side circuit device 65 side and makes contact with the contact terminals P2 to which the upper surface electrodes Bb are facing.

Furthermore, at this time, the distal ends of the connection electrodes P3 provided in predetermined positions with respect to the contact terminals P2 of the holding-side circuit device 65 makes contact with the exposed parts of the connection electrodes P5 provided in predetermined positions with respect to the contact terminals P1 above the testing socket 24. The upper surface electrodes Bb of the electronic component T are thereby connected to the tester 25 via the contact terminals P2, the connection electrodes P3, the connection electrodes P5, and the circuitry of the testing unit 23.

As described above, in accordance with the electronic component testing device of the present embodiment, the following effects can be obtained.

(1) Contact terminals P2 capable of making contact with the upper surface electrodes Bb of the electronic component T are provided to the holding part 63, whereby the holding part 63 can optimally hold the electronic component T, and the positional relationship between the contact terminals P2 and the upper surface electrodes Bb of the held electronic component T are kept in a corresponding relationship as a matter of course. The testing head 22 is provided with a position adjustment part 62 for adjusting the position of the holding part 63, i.e., the movement position in the direction parallel (horizontal direction, XY directions) to the testing socket 24, and the rotational position about the Z-direction, and the like. It is thereby possible to optimally ensure and maintain the holding orientation when the holding part 63 holds the electronic component T, and the holding orientation in relation to the testing socket 24 of the holding part 63 holding the electronic component T, via the orientation control described above carried out by the control device 70.

(2) The holding orientation when the holding part 63 holds the electronic component T is determined with reference to the image data of the upper surface electrodes Bb of the electronic component T imaged by the lower imaging devices 50, 55, and the image data of the contact terminals P2 of the holding part 63 imaged by the first or second shuttle imaging device 37, 38. Also, the holding orientation of the holding part 63 holding the electronic component T in relation to the testing socket 24 is determined with reference to the image data of the lower surface electrodes Ba of the electronic component T held by the holding part 63 as imaged by the first or second shuttle imaging device 37, 38, and the image data of the contact terminals P1 of the testing socket 24 imaged by the lower imaging devices 50, 55. Such a configuration makes it possible to reliably obtain electroconductivity between the upper surface electrodes Bb and lower surface electrodes Ba of the electronic component T and the contact terminals P1, P2 and testing socket 24.

(3) In an electronic component T having an ordinary package-on-package structure, the connection electrodes P3 of the holding part 63 electrically connected to the upper surface electrodes Bb of the electronic component T are positionally matched to the connection electrodes P5 of the testing socket 24 provided further outside from the external periphery of the electronic component T due to the arrangement of the electronic component T in relation to the testing socket 24. The electronic component T can thereby be electrically tested via the upper surface electrodes Bb and the lower surface electrodes Ba.

(4) A simple configuration can be obtained and convenience is improved because the field of view of the first and second lower imaging devices 50, 55 move in accompaniment with the movement of the pressing device 60.

(5) The number of imaging devices can be reduced and the number of components can be reduced because the first and second lower imaging devices 50, 55 are shared between the imaging of the image of the upper surface electrodes Bb of the electronic component T prior to being held and the imaging of the image of the testing socket 24.

(6) The number of imaging devices can be reduced and the number of components can be reduced because the first or second shuttle imaging devices 37, 38 are shared between the imaging of the image of the contact terminals P2 or connection electrodes P3 provided to the testing head 22 (holding part 63), and the imaging of image of the lower surface electrodes Ba (second surface electrodes) of the electronic component T held by the holding part 63.

(7) The stability of the holding force on the electronic component T by the holding part 63 is maintained because the contact terminals P2 of the holding part 63 and the upper surface electrodes Bb of the electronic component T are pressed to the testing socket 24 in a non-contact state. The non-contact state is overcome by application of the pressing force applied by the pressing device 60, that is to say, the upper surface electrodes Bb of the electronic component T and the contact terminals P2 of the holding part 63 make contact and assume an electrically connected state.

(8) The part placement position 31A (placement position) of the shuttle 16 (17) is imaged and recognized together with the shuttle reference marks set in advance in predetermined positions, and the orientation of the upper surface electrodes Bb of the electronic component T in relation to the shuttle reference marks is recognized. The contact terminals P2 of the holding part 63 are imaged and recognized together with the head reference marks set in advance on the testing head 22, and the position of the contact terminals P2 in relation to the head reference marks is recognized. The position of the upper surface electrodes Bb of the electronic component T and the position of the testing head 22 can be positionally matched by using the shuttle reference marks and the head reference marks by adopting such head reference marks and shuttle reference marks, and adjustment of the orientation of the holding part 63 can be more readily carried out.

(9) The testing socket 24 is imaged and recognized together with the socket reference marks set in advance in predetermined positions, and the orientation of the testing socket 24 in relation to the socket reference marks is recognized. The electronic component T held by the holding part 63 is imaged and recognized together with the head reference marks provided in advance to the testing head, and the orientation of the lower surface electrodes Ba of the electronic component T in relation to the head reference marks is recognized. The position of the testing socket 24 and the position of the lower surface electrodes Ba of the electronic component T held by the testing head 22 can be positionally matched by using the shuttle reference marks and the head reference marks by adopting such shuttle reference marks and head reference marks, and adjustment of the orientation of the holding part 63 can be more readily carried out.

(10) The adjustment of the orientation of the holding part 63 can be more readily carried out by adopting the shuttle reference marks, head reference marks, and socket reference marks together. Also, convenience is increased by sharing the head reference marks between recognition of the orientation of the holding part 63 and recognition of the orientation of the lower surface electrodes Ba of the electronic component T.

(11) The electronic component T placed in the part placement position 31A of the supply change kit 31 is imaged and recognized together with the shuttle reference marks, and the orientation of the upper surface electrodes Bb of the electronic component T in relation to the shuttle reference marks is recognized. The electronic component T can be advantageously held by the holding part 63 by adjusting the orientation of the holding part 63 of the testing head 22 because the position and orientation of the electronic component T placed on the supply change kit 31 are recognized in the case that a pocket or the like for holding the electronic component T in the supply change kit 31 is not provided.

The embodiment described above can be implemented in modes such as those described below.

In the embodiment described above, a case was described in which the image processing unit 71 carried out the processes for recognizing the orientation, but no limitation is imposed thereby, and it is also possible for the control device to process all or a part of the processes carried out by the image processing unit, and conversely, it is also possible for the image processing unit to carry out a portion of the processing performed by the control device. The degree of freedom of the configuration of the electronic component testing device can thereby be improved.

In the embodiment described above, the orientation of the holding part 63 is recognized based on the arrangement of the contact terminals P2, but no limitation is imposed thereby, and it is also possible for the orientation of the holding part to be recognized from the array of contact terminals and the array of connection terminals, or from only the array of connection terminals. The degree of freedom of the processing mode for recognizing orientation as carried out by the electronic component testing device can thereby be improved.

In the embodiment described above, the case is described in which the socket reference marks KM11 to KM18 are provided so as to protrude toward the testing unit 23, and the shuttle reference marks SM11 to SM18 (SM21 to SM28) are provided so as to protrude toward the supply change kit 31. However, no limitation is imposed thereby; it also being possible for the socket reference marks and the shuttle reference marks to be concavely provided, to be printed, to be embedded, or to emit light, as long as the marks can be recognized from the images captured by the cameras. The recognizability of the reference marks and the environment resistance characteristics can thereby be set in accordance with the installation environment, and the application environment of the electronic component testing device can be expanded and adoptability can be improved.

Figure 22A:
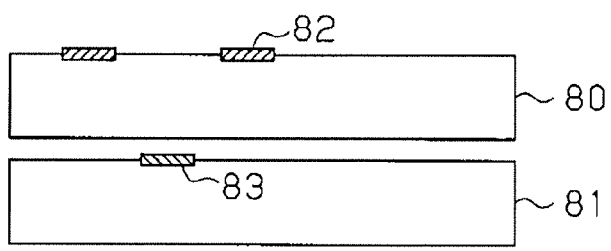
Figure 22B:
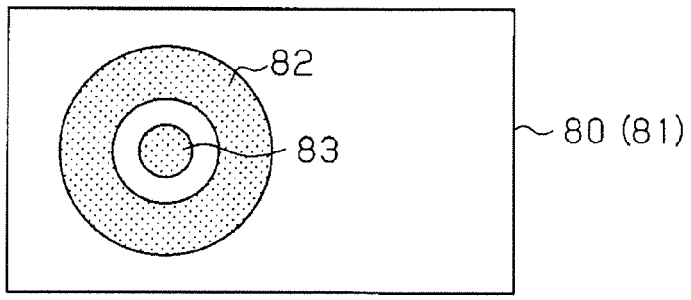

In the embodiment described above, the case is described in which corresponding socket reference marks KM11 to KM18 and the shuttle reference marks SM11 to SM18 (SM21 to SM28) can be inserted into the head reference marks HM1 to HM8. However, no limitation is imposed thereby; it also being possible for the socket reference marks and the shuttle reference marks to be aligned next to, e.g., the head reference marks without insertion into the head reference marks, as long as the relative positional relationship between the reference marks can be advantageously acquired. For example, the testing head may be provided with a head reference mark on a mark body 80 formed using glass or the like having optical transparency, and the socket reference marks or the shuttle reference marks may be provided as planar marks 83 to a mounting body 81 that is attached to the supply change kit 31 or the testing unit 23, as shown in FIGS. 22A and 22B. The degree of freedom of the mode of the reference marks provided to the electronic component testing device can thereby be increased.

In the embodiment described above, the case is described in which a single first lower imaging device 50 is provided to the supply robot 14 side and a single second lower imaging device 55 is provided to the recovery robot 15 side. However, no limitation is imposed thereby; it also being possible for a plurality of lower imaging devices to be provided to the supply robot side and for a plurality of lower imaging devices to be provided to the recovery robot side. For example, in the case that the lower imaging devices are provided in the same number as the number of sockets, images of a plurality of sockets are imaged in a single cycle by the lower imaging devices. The time required for orientation recognition processing can thereby be reduced in concert with a reduction of the time required for capturing images by the lower imaging devices.

In the embodiment described above, the case is described in which the lower imaging devices 50, 55 are mounted on the testing head 22. However, no limitation is imposed thereby; it also being possible for the lower imaging devices to be provided separate from the testing head and to be capable of moving above the shuttle and the testing unit. The degrees of freedom of the arrangement of the lower imaging devices can thereby be increased.

In the embodiment described above, the case is described in which the lines of sight of the cameras 40A, 40B, 45A, 45B, 51, 56 are refracted by the mirrors 41A, 41B, 46A, 46B, 52, 57. However, no limitation is imposed thereby; it also being possible for the lines of sight of the cameras to directly capture the imaging targets. The degree of freedom for installing the cameras can be increased, and the degree of freedom of the configuration of the imaging devices having the cameras can also be improved.

In the embodiment described above, the case is described in which the cameras 40A, 40B, 45A, 45B are provided to the lower surface of the shuttles 16, 17, but no limitation is imposed thereby, and it is also possible for the cameras to be provided to the upper surface or the side surface of the shuttle, as long as the cameras can image the holding part. The degree of freedom of the configuration of the electronic component testing device can thereby be increased.

In the embodiment described above, the case is described in which the first and second shuttle imaging devices 37, 38 are provided to the shuttles 16, 17, but no limitation is imposed thereby, and it is also possible for the first and second shuttle imaging devices to be provided on the base, the testing unit, or the like as long as the cameras can image the holding part. The degree of freedom of the configuration of the electronic component testing device can thereby be increased in this case as well.

In the embodiment described above, the case is described in which a part placement position 31A is set on the supply change kit 31. However, no limitation is imposed thereby; it also being possible to provide a pocket for placing the electronic component on the supply change kit 31. The applicability of the electronic component testing device can thereby be increased.

In the embodiment described above, the case is described in which four pressing devices 60 are provided to the head unit 27. However, no limitation is imposed thereby, and three or fewer pressing devices may be provided, or five or more pressing devices may be provided. The degree of freedom of the configuration of the electronic component testing device can thereby be increased.

In the embodiment described above, the case is described in which connection electrodes P5 are provided to the testing socket 24. However, no limitation is imposed thereby; it also being possible for connection electrodes to be provided to the periphery of the testing socket, e.g., a substrate or the like on which the testing unit or testing socket is mounted, without limitation to a testing socket as long as the connection electrodes can face the holding-side circuit device. In this case, an electrical connection between the tester and the upper surface electrodes of the electronic component can be maintained by arranging the connection terminals of the holding-side circuit device in conformity with the arrangement of the connection electrodes. The possibility that the electronic component testing device can be applied to a testing device for package-on-package electronic components is thereby improved, regardless of the structure of the holding-side circuit device and the testing unit (testing socket).

In the embodiment described above, the case is described in which the downward protruding length of the connection electrodes P3 is less than that of the contact terminals P2. However, no limitation is imposed thereby; it also being possible for the length of the connection terminals to be the height of the upper-surface electrodes of the electronic component with which contact is to be made, or a length that corresponds to the height of the connection electrodes. The shape of the holding-side circuit device may be modified into a suitable shape that corresponds to the testing unit or the testing socket. It is thereby possible to accommodate a variety of testing units and testing sockets.

In the embodiment described above, the case is described in which an image of the upper surface electrodes Bb of the electronic component T prior to being held and the image of the testing socket 24 are both imaged by a lower imaging device 50 (55). However, no limitation is imposed thereby; it also being possible to use separate imaging devices to imaging the image of the upper-surface electrodes of the electronic component prior to be held and the testing socket. The degree of freedom of the arrangement of the imaging devices can thereby be increased.

In the embodiment described above, the case is described in which an image of the contact terminals P2 or the connection electrodes P3 set in the testing head 22 (holding part 63) and the image of the lower surface electrodes Ba (second surface electrode) of the electronic component T held by the holding part 63 are both imaged by the first shuttle imaging device 37 or the second shuttle imaging device 38. However, no limitation is imposed thereby; it also being possible to use separate imaging devices to capture the image of the connection terminals or the contact terminals provided to the testing head (holding part) and the image of the lower-surface electrodes of the electronic component held by the holding part. The degree of freedom of the arrangement of the imaging devices can thereby be increased.

In the embodiment described above, the case is described in which a step (step S11) for recognizing the orientation of the holding part is carried out subsequent to a step (step S10) for recognizing the orientation of the electronic component before being held, but no limitation is imposed thereby; it also being possible to carry out the step for recognizing the orientation of the holding part in advance of the step for recognizing the orientation of the electronic component before being held. The degree of freedom of the processing order of the orientation recognition steps is improved in this manner, whereby the degree of freedom of the procedure for transporting the electronic component can also be improved.

In the embodiment described above, the case is described in which a step (step S11) for recognizing the orientation of the holding part is carried out every cycle, but no limitation is imposed thereby, and it is also possible for the step for recognizing the orientation of the holding part to be omitted as long as the orientation precision of the holding part is maintained. In this case, it is possible to carry out the step at predetermined time, under predetermined conditions, or with any timing. The degree of freedom of the execution timing the orientation recognition steps can be improved in this manner, whereby the degree of freedom of the procedure for transporting the electronic component can be improved.

In the embodiment described above, the case is described in which a step (step S14) for recognizing the orientation of the held electronic component is carried out subsequent to the step (step S13) for recognizing the orientation of the testing socket, but no limitation is imposed thereby, and it is also possible to carry out the step for recognizing the orientation of the held electronic component prior to the step for recognizing the orientation of the testing socket. The degree of freedom of the processing order of the orientation recognition steps is improved in this manner, whereby the degree of freedom of the procedure for transporting the electronic component can also be improved.

In the embodiment described above, the case is described in which a step (step S13) for recognizing the orientation of the testing socket is carried out every cycle, but no limitation is imposed thereby, and it is also possible for the step for recognizing the orientation of the testing socket to be omitted as long as the orientation precision of the testing socket is maintained. In this case, it is possible to carry out the step at a predetermined time, under predetermined conditions, or with any other desired timing. The degree of freedom of the execution timing the orientation recognition steps can be improved in this manner, whereby the degree of freedom of the procedure for transporting the electronic component can be improved.

In the embodiment described above, the case is described in which, in the step (S12) for acquiring the electronic component prior to being held, the orientation of the holding part 63 is made to conform to the orientation of the electronic component T after the holding part 63 has been moved above the electronic component T. However, no limitation is imposed thereby; it also being possible for the orientation of the holding part to be made to conform to the orientation of the electronic component before or at a midway point of moving the holding part above the electronic component. The mode for adjusting the orientation of the holding part can thereby be expanded, and the degree of freedom of the procedure for transporting the electronic component can also be improved.

In the embodiment described above, the case is described in which, in the step (step S15) for arranging the electronic component in the testing socket, the orientation of the electronic component T held in the holding part 63 is made to conform to the orientation of the testing socket 24 after the holding part 63 has been moved above the testing socket 24. However, no limitation is imposed thereby; it also being possible for the orientation of the electronic component held by the holding part to be made to conform to the orientation of the testing socket before or at a midway point of moving the holding part above the testing socket. The mode for adjusting the orientation of the electronic component held by the holding part can thereby be expanded, and the degree of freedom of the procedure for transporting the electronic component can also be improved.

In the embodiment described above, the case is described in which the setting of the socket reference mark position and the shuttle reference mark position is carried out in advance. However, no limitation is imposed thereby; it also being possible carry out the setting as needed during the procedures for transporting the electronic component to the testing socket. The precision of the arrangement of the electronic component can thereby be improved and precision can be ensured.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. An electronic component testing device, comprising:
   a testing socket configured and arranged to receive an electronic component therein when the electronic component is to be electrically tested, the electronic component having a first-surface electrode on a first surface and a second-surface electrode on a second surface opposite from the first surface;
   a testing head configured and arranged to transport and arrange the electronic component in the testing socket, the testing head having
      a holding part configured and arranged to hold the electronic component,
      a position adjustment part configured and arranged to adjust a position of the holding part, and
      a contact terminal that is provided to the holding part and is configured and arranged to make contact with the first-surface electrode of the electronic component held by the holding part;
   a first imaging device configured and arranged to capture an image of the first-surface electrode of the electronic component before the electronic component is held by the holding part;
   a second imaging device configured and arranged to capture an image of the contact terminal provided to the testing head;
   a third imaging device configured and arranged to capture an image of the second-surface electrode of the electronic component held by the holding part;
   a fourth imaging device configured and arranged to capture an image of the testing socket; and
   a control device configured to control the position adjustment part of the testing head to adjust the position of the holding part so that
      a holding orientation when the holding part holds the electronic component is controlled based on the images captured by the first and second imaging devices, and
      a holding orientation, with respect to the testing socket, of the holding part holding the electronic component is controlled based on the images captured by the third and fourth imaging devices.

2. The electronic component testing device according to claim 1, further comprising
a connection electrode disposed further outside from an external periphery of the electronic component arranged in the testing socket to ensure electrical conductivity with the first-surface electrode of the electronic component,
a connection terminal configured and arranged to make contact with the connection electrode being provided to the holding part.

3. The electronic component testing device according to claim 1, wherein
at least one of the first imaging device and the fourth imaging device is provided to the testing head.

4. The electronic component testing device according to claim 1, wherein
the first imaging device and the fourth imaging device are a single, shared imaging device.

5. The electronic component testing device according to claim 1, wherein
the second imaging device and the third imaging device are a single, shared imaging device.

6. The electronic component testing device according to claim 1, wherein
the holding part is configured and arranged to hold the electronic component so that the contact terminal and the first-surface electrode of the electronic component are kept in a state of non-contact, and
the second-surface electrode of the electronic component is configured and arranged to make contact with the contact terminal of the testing socket when the testing head presses the electronic component held by the holding part against the testing socket, whereupon the contact terminal of the holding part that was held in the non-contact state makes contact with the first-surface electrode of the electronic component.

7. An electronic component transport method for transporting and arranging an electronic component in a testing socket for electrically testing the electronic component, using a testing head having a holding part for holding the electronic component provided with a first-surface electrode on a first surface and a second-surface electrode on a second surface opposite from the first surface, a position adjustment part for adjusting a position of the holding part, and a contact terminal that is provided to the holding part and is capable of making contact with the first-surface electrode of the electronic component held by the holding part, the electronic component transport method comprising:
performing image-recognition of the first-surface electrode of the electronic component before the electronic component is held by the holding part, and recognizing a position of the first-surface electrode of the electronic component;
performing image-recognition of the contact terminal provided to the testing head, and recognizing a position of the contact terminal;
adjusting an orientation of the holding part via the position adjustment part of the testing head, and holding the electronic component in the holding part, so that the position of the contact terminal recognized in the performing of the image recognition of the contact terminal conforms to the position of the first-surface electrode of the electronic component recognized in the performing of the image-recognition of the first-surface electrode;
performing image-recognition of the testing socket, and recognizing a position of the testing socket;
performing image-recognition of the second-surface electrode of the electronic component held by the holding part, and recognizing a position of the second-surface electrode of the electronic component; and
adjusting the orientation of the holding part via the position adjustment part of the testing head, and maintaining the orientation of the holding part for the electronic component to be arranged in the testing socket, so that the position of the second-surface electrode of the electronic component recognized in the performing of the image-recognition of the second-surface electrode conforms to the position of the testing socket recognized in the performing of the image-recognition of the testing socket.

8. The electronic component transport method according to claim 7, wherein
the testing head includes a connection electrode for ensuring electrical conductivity with the first-surface electrode of the electronic component provided further outside from the external periphery of the electronic component arranged in the testing socket, and a connection terminal capable of making contact with the connection electrode provided to the holding part,
the electronic component transport method further comprising,
carrying out positioning of the connection terminal of the testing socket with respect to the connection electrode together with the arranging of the electronic component with respect to the testing socket.

9. The electronic component transport method according to claim 7, wherein
the performing of the image-recognition of the first-surface electrode includes performing image-recognition of a first reference mark provided in advance in a predetermined position in relation to a placement position of the electronic component, and recognizing the position of the first-surface electrode of the electronic component in relation to the first reference mark, and
the performing of the image-recognition of the contact terminal includes performing image-recognition of a second reference mark provided in advance to the testing head as a mark that is in a predetermined relative position with respect to the first reference mark, and recognizing the position of the contact terminal in relation to the second reference mark.

10. The electronic component transport method according to claim 7, wherein
the performing of the image-recognition of the testing socket includes performing image-recognition of a third reference mark provided in advance in a predetermined position in relation to the testing socket, and recognizing the position of the testing socket in relation to the third reference mark; and
the performing of the image-recognition of the second surface-electrode includes performing image-recognition of a fourth reference mark provided in advance to the testing head as a mark that is in a predetermined relative position with respect to the third reference mark, and recognizing the position of the second-surface electrode of the electronic component in relation to the fourth reference mark.

11. The electronic component transport method according to claim 7, wherein
the performing of the image-recognition of the first-surface electrode includes performing image-recognition of a first reference mark provided in advance in a predetermined position in relation to a placement position of the electronic component, and recognizing the position of the first-surface electrode of the electronic component in relation to the first reference mark, the performing of the image-recognition of the contact terminal includes performing image-recognition of a second reference mark provided in advance to the testing head as a mark that is in a predetermined relative position with respect to the first reference mark, and recognizing the position of the contact terminal in relation to the second reference mark, the performing of the image-recognition of the testing socket includes performing image-recognition of a third reference mark provided in advance in a predetermined position in relation to the testing socket, and recognizing the position of the testing socket in relation to the third reference mark, the performing of the image-recognition of the second surface-electrode includes performing image-recognition of a fourth reference mark provided in advance to the testing head as a mark that is in a predetermined relative position with respect to the third reference mark and recognizing the position of the second-surface electrode of the electronic component in relation to the fourth reference mark, and the second reference mark and the fourth reference mark are the same reference mark.

12. The electronic component transport method according to claim 7, wherein when the electronic component is arranged in relation to the testing socket, the electronic component is pressed to the testing socket in a state in which the contact terminal is kept in a non-contact state in relation to the first-surface electrode of the electronic component held by the holding part, and the second-surface electrode of the electronic component makes contact with the contact terminal of the testing socket by the pressing, whereupon the contact terminal of the testing head that was held in the non-contact state makes contact with the first-surface electrode of the electronic component.

* * * * *